US006811962B2

(12) United States Patent
Yoshihara et al.

(10) Patent No.: US 6,811,962 B2
(45) Date of Patent: Nov. 2, 2004

(54) METHOD FOR DEVELOPING PROCESSING AND APPARATUS FOR SUPPLYING DEVELOPING SOLUTION

(75) Inventors: Kousuke Yoshihara, Kumamoto (JP); Keiichi Tanaka, Kumamoto (JP); Taro Yamamoto, Kumamoto (JP); Hideharu Kyouda, Kumamoto (JP); Hirofumi Takeguchi, Kumamoto (JP); Atsushi Ookouchi, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/227,814

(22) Filed: Aug. 27, 2002

(65) Prior Publication Data

US 2003/0044731 A1 Mar. 6, 2003

(30) Foreign Application Priority Data

Aug. 28, 2001 (JP) ...................................... 2001-257810
May 21, 2002 (JP) ...................................... 2002-146594

(51) Int. Cl.[7] ............................. G03F 7/30; G03F 7/38; G03F 7/32
(52) U.S. Cl. ...................... 430/325; 430/311; 430/312; 430/326; 430/331; 396/611
(58) Field of Search ............................... 430/311, 312, 430/325, 326, 331, 421; 396/611

(56) References Cited

U.S. PATENT DOCUMENTS

| 4,613,561 | A | * | 9/1986 | Lewis | ........................ 430/331 |
|---|---|---|---|---|---|
| 4,688,918 | A | * | 8/1987 | Suzuki et al. | |
| 4,873,177 | A | * | 10/1989 | Tanaka et al. | ............... 430/326 |
| 5,292,605 | A | * | 3/1994 | Thomson | ..................... 430/325 |
| 5,854,953 | A | | 12/1998 | Semba | ........................ 396/611 |
| 5,919,520 | A | | 7/1999 | Tateyama et al. | |
| 5,968,268 | A | | 10/1999 | Kitano et al. | |
| 6,059,880 | A | | 5/2000 | Kitano et al. | |
| 6,267,516 | B1 | | 7/2001 | Nagamine et al. | .......... 396/604 |
| 6,352,818 | B1 | * | 3/2002 | Hsieh | .......................... 430/326 |
| 6,419,408 | B1 | * | 7/2002 | Inada | ......................... 396/611 |
| 6,451,510 | B1 | * | 9/2002 | Messick et al. | ............. 430/325 |

FOREIGN PATENT DOCUMENTS

JP 63-229452 * 9/1988

* cited by examiner

Primary Examiner—Richard L. Schilling
(74) Attorney, Agent, or Firm—Oblon, Spivak, McClelland, Maier & Neustadt, P.C.

(57) ABSTRACT

In a developing processing of a wafer having a resist film low in the dissolving rate in a developing solution formed thereon and subjected to an exposure treatment, a developing solution of a low concentration is supplied first onto a wafer and the wafer is left to stand for a prescribed time to permit a developing reaction to proceed, followed by further supplying a developing solution having a concentration higher than that of the developing solution supplied first onto the wafer, leaving the substrate to stand and subsequently rinsing the wafer, thereby improving the uniformity of the line width in the central portion and the peripheral portion of the wafer.

10 Claims, 18 Drawing Sheets

START-UP OF
DEVELOPING PROCESSING

TO DISSOLVE RESIST FILM
TO REACH BOTTOM PORTION

DISSOLVED PRODUCT REMAINS
HIGH CONCENTRATION

TO LOWER CONCENTRATION
OF DISSOLVED PRODUCT

REMOVAL OF DISSOLVED PRODUCT

VALUE OF 3σ : 0.0126 μm

VALUE OF $3\sigma$ : 0.0126 μm

//METHOD FOR DEVELOPING PROCESSING AND APPARATUS FOR SUPPLYING DEVELOPING SOLUTION

BACKGROUND OF THE INVENTION

1. Field of the Invention

The present invention relates to a method for a developing processing of a substrate such as a semiconductor wafer subjected to an exposure treatment and an apparatus for supplying a developing solution.

2. Description of the Related Art

In a manufacturing process of a semiconductor device, a prescribed circuit pattern is formed on the surface of a semiconductor wafer by using a so-called "photolithography technology". In the photolithography step, a series of treatments are carried out such that a resist film is formed on a cleaned semiconductor wafer by supplying a photoresist solution onto the semiconductor wafer, followed by exposing the resist film to light in a prescribed pattern and subsequently developing the pattern.

In the developing step, an exposed semiconductor wafer is held first by a rotatable spin chuck. Then, a puddle of a developing solution is formed by supplying a developing solution onto the surface of a semiconductor wafer held stationary by the spin chuck, and the developing solution supplied onto the surface of the semiconductor wafer is left to stand for a prescribed time so as to permit the developing reaction to proceed. In the next step, a rinsing liquid such as a pure water is supplied onto the semiconductor wafer while rotating the semiconductor wafer so as to rinse the semiconductor wafer. Finally, the supply of the rinsing liquid onto the semiconductor wafer is stopped, and the semiconductor wafer is rotated at a high speed so as to dry the semiconductor wafer by a spin drying. In this case, a TMAH solution having a fixed concentration of, for example, 2.38% by weight for the various resist materials is used as the developing solution.

Strictly speaking, however, the appropriate concentration of the developing solution differs for each resist material. Further, the appropriate concentration of the developing solution is changed with the reaction time during the developing reaction. It was possible in the past to obtain the required accuracy in, for example, the shape of the circuit pattern even if a developing solution having a predetermined concentration is used for a plurality of different resist materials. In recent years, however, a resist material having a high reactivity to the developing solution has come to be used. Further, the resist film has come to be formed thinner. Further, the light having a shorter wavelength has come to be used for the exposure, and the pattern exposed to light has been made finer and finer. Under the circumstances, it is difficult nowadays to form a satisfactory circuit pattern by the conventional method for the developing processing using a developing solution of a predetermined concentration.

Further, in the conventional method for the developing processing, which is carried out with the semiconductor wafer held stationary, a dissolved product formed by the developing reaction, which dissolves the resist film, remains in a high concentration in a part on the surface of the semiconductor wafer. Therefore, in the latter stage of the developing processing, the state of equilibrium between the dissolved product remaining in a high concentration and the developing solution is collapsed, with the result that the dissolved product is diffused toward the developing solution. It is possible for the movement of the developing solution accompanying the diffusion of the dissolved product to bring about a change in a partial critical dimension (CD), i.e., the line width of the pattern, on the wafer surface. Further, if the developing solution and the dissolved product are removed by rotating the wafer simultaneously with start-up of the supply of a rinsing liquid after the developing processing, the dissolved product leaves their traces on the wafer surface when the dissolved product of a high concentration is centrifugally expanded. Naturally, the traces of the dissolved product left on the wafer surface degrades the wafer.

As described above, the dissolved product of the resist affects the CD in the latter stage of the developing processing. What should be noted is that, since the generating amount of the dissolved product differs depending on the aperture rate of the mask, the CD distribution on the wafer surface is rendered different depending on the aperture rate of the mask in spite of the same pattern. Further, the CD in the central portion is rendered different from that in the outer circumferential portion within a single shot. In conclusion, in the conventional method for the developing processing, the CD uniformity on the substrate is not necessarily satisfactory. It was customary in the past to deal with the problem by, for example, correcting the pattern of the mask under the prescribed conditions for the developing processing. However, it is highly laborious to determine appropriately the conditions for the developing processing.

What should also be noted is that, if a pure water is supplied onto a semiconductor wafer after completion of the developing reaction, the pH value of the developing solution on the semiconductor wafer is rapidly lowered, with the result that the dissolved product is precipitated in the form of a solid material so as to be attached to the developing pattern, thereby generating a defect.

BRIEF SUMMARY OF THE INVENTION

A first object of the present invention is to provide an appropriate method for a developing processing conforming to the characteristics of the resist material relative to the developing solution. A second object of the present invention is to provide a method for a developing processing with an improved CD uniformity. A third object of the present invention is to provide a method for a developing processing, which permits suppressing the defect generation caused by the precipitation of the dissolved product in the form of a solid material during the developing processing. Further, a fourth object of the present invention is to provide an apparatus for supplying a developing solution used in the method of the present invention for the developing processing.

According to a first aspect of the present invention, there is provided a method for a developing processing of a resist film formed on a substrate, said resist film being applied to an exposure treatment, said method comprising steps of:

adjusting the concentration of a developing solution in accordance with the characteristics of said resist film; and applying a developing processing to said resist film using said concentration-adjusted developing solution.

According to a second aspect of the present invention, there is provided a method of a resist film formed on a substrate, said resist film being applied to an exposure treatment, said method comprising the steps of:

supplying a first developing solution onto said substrate;

leaving the substrate having said first developing solution supplied thereto to stand for a prescribed time so as to permit a developing reaction to proceed;

further supplying a second developing solution differing from said first developing solution in concentration onto said substrate;

leaving the substrate having said second developing solution supplied thereto to stand for a prescribed time so as to permit a developing reaction to proceed; and rinsing the substrate having said second developing solution supplied thereto.

In the method for the developing processing according to each of the first and second aspects of the present invention, it is possible to carry out the developing processing by using a developing solution having an appropriate concentration conforming to the characteristics of the resist film relative to the developing solution. Further, since the step for the developing processing can be finely controlled by, for example, using a plurality of developing solutions differing from each other in the concentration, it is possible to obtain a circuit pattern satisfactory in, for example, the accuracy of the shape.

According to a third aspect of the present invention, there is provided a method for a developing processing of a resist film formed on a substrate, said resist film being applied to an exposure treatment, said method comprising the steps of:

supplying a first developing solution onto the surface of said substrate;

leaving the substrate having said first developing solution supplied thereto to stand for a prescribed time to permit a developing reaction to proceed;

supplying a second developing solution onto the substrate having said first developing solution supplied thereto;

leaving the substrate having said second developing solution supplied thereto to stand for a prescribed time so as to permit the concentration of the dissolved product formed by the developing reaction of said first developing solution to be lowered by said second developing solution; and rinsing the substrate having said second developing solution supplied thereto.

According to a fourth aspect of the present invention, there is provided a method for a developing processing of a resist film formed on a substrate, said resist film being applied to an exposure treatment, said method comprising the steps of:

supplying a developing solution onto said substrate;

leaving the substrate having said developing solution supplied thereto to stand for a prescribed time so as to permit a developing reaction to proceed;

supplying a liquid that does not dissolve a resist film or a liquid low in the dissolving power of the resist film onto the substrate having said developing solution supplied thereto;

leaving the substrate having said liquid supplied thereto to stand for a prescribed time so as to permit the concentration of the dissolved product formed by said developing solution to be lowered by said liquid; and, rinsing the substrate having said liquid supplied thereto.

In the method for the developing processing according to each of the third and fourth aspects of the present invention, the concentration of the dissolved product is lowered so as to prevent the generation of the traces of the development and, thus, to improve the quality. Further, it is possible to improve the CD uniformity on the substrate surface. Particularly, in the method for the developing processing according to the fourth aspect of the present invention, it is desirable to use a liquid, which does not change rapidly the pH value of the developing solution supplied onto the substrate, as the liquid used for the coating after supply of the developing solution onto the substrate. In this case, it is possible to suppress generation of the defect caused by the precipitation in the form of a solid material of the dissolved product derived from the rapid change in the pH value of the developing solution supplied onto the substrate.

According to the present invention, provided is an apparatus for supplying a developing solution, which can be suitably employed in the method of the present invention for the developing processing described above. To be more specific, according to a fifth aspect of the present invention, there is provided an apparatus for supplying a developing solution onto a substrate, comprising:

a developing solution spurting nozzle having a long shape in one direction and serving to spurt a developing solution in substantially a band shape in the longitudinal direction thereof;

a first liquid supply device for supplying a developing solution having a prescribed concentration into said developing solution spurting nozzle; and a second liquid supply device for supplying a pure water or a developing solution differing in concentration from the developing solution supplied from said first liquid supply device into said developing solution spurting nozzle;

wherein said developing solution spurting nozzle comprises:

a first liquid reservoir for storing the developing solution supplied from said first liquid supply device;

a second liquid reservoir for storing the pure water or the developing solution supplied from said second liquid supply device;

a liquid mixing chamber having a developing solution spurting port for spurting a developing solution or a pure water formed in the lower end and communicating with said first liquid reservoir and said second liquid reservoir;

a first communicating passageway for allowing said first liquid reservoir to communicate with said liquid mixing chamber; and a second communicating passageway for allowing said second liquid reservoir to communicate with said liquid mixing chamber, and wherein said developing solution, said pure water and said developing solution having a different concentration are separately spurted from said developing solution spurting port, or the developing solution stored in said first liquid reservoir is mixed with the pure water or the developing solution having a different concentration, which is stored in said second liquid reservoir, in said liquid mixing chamber so as to prepare a developing solution having a prescribed concentration, said developing solution, which has a prescribed concentration, being spurted from said developing solution spurting port.

Further, according to a sixth aspect of the present invention, there is provided an apparatus for supplying a developing onto a substrate, comprising:

a developing solution spurting nozzle having a long shape in one direction and serving to spurt the developing solution in substantially a band shape in the longitudinal direction thereof;

a developing solution supply device for supplying a developing solution having a prescribed concentration into said developing solution spurting nozzle; and a plurality of liquid supply devices for separately supplying a plurality of different kinds of liquid materials into said developing solution spurting nozzle, wherein said developing solution spurting nozzle comprises:

a developing solution reservoir for storing the developing solution supplied from said developing solution supply device;

a plurality of liquid reservoirs for separately storing a plurality of different kinds of liquid materials supplied from said plural liquid supply devices;

a liquid mixing chamber having a liquid spurting port for spurting a developing solution or said plural kinds of liquid materials formed in the lower end and communicating with said developing solution reservoir and with said plural liquid reservoirs;

a first communicating passageway for allowing said developing solution reservoir to communicate with said liquid mixing chamber; and a second communicating passageway for allowing each of said plural liquid reservoirs to communicate with said liquid mixing chamber, and wherein said developing solution and said plural different kinds of liquid materials are spurted separately from said liquid spurting port, or at least two kinds of liquid materials selected from said plural kinds of different materials are mixed in said liquid mixing chamber so as to prepare a prescribed liquid material, which is spurted from said liquid spurting port.

According to the particular apparatus for supplying a developing solution of the present invention, it is possible to adjust the concentration of the developing solution easily. Further, since it is unnecessary to arrange a plurality of nozzles in accordance with the concentration of the developing solution, the construction of the apparatus can be simplified.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detail description of the preferred embodiments given below, serve to explain the principles of the invention.

DETAILED DESCRIPTION OF THE INVENTION

Some embodiments of the present invention will now be described in detail with reference to the accompanying drawings. Described in this case is a method for a developing processing using a resist coating and development system, which permits continuously carrying out the process steps ranging between the resist coating on a semiconductor wafer and the developing processing.

Figure 1:
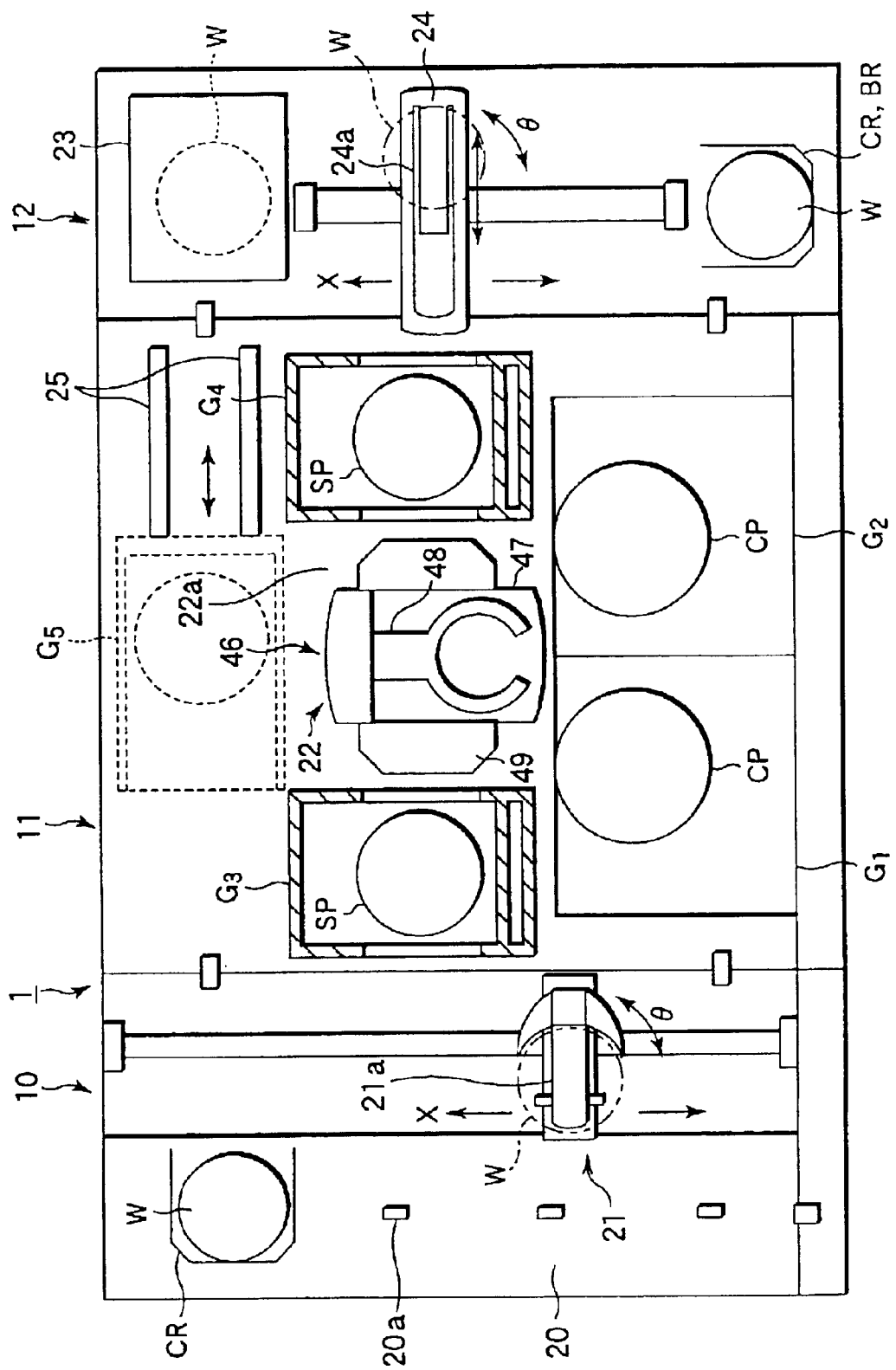
FIG. 1 is a plan view schematically showing the construction of a resist coating and development system according to one embodiment of the present invention.
Figure 2:
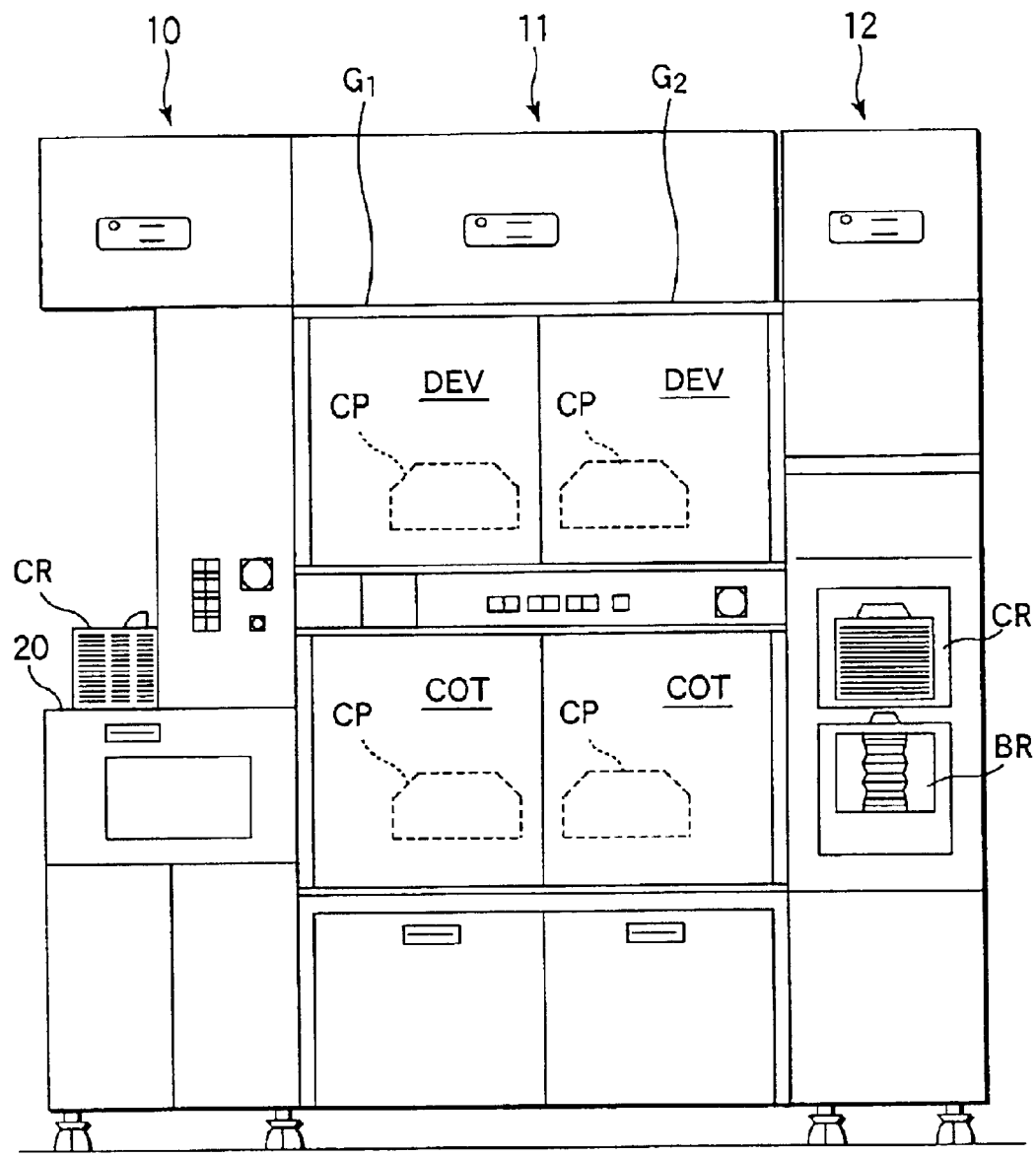
FIG. 2 is a front view schematically showing the construction of the resist coating and development system shown in FIG. 1.
Figure 3:
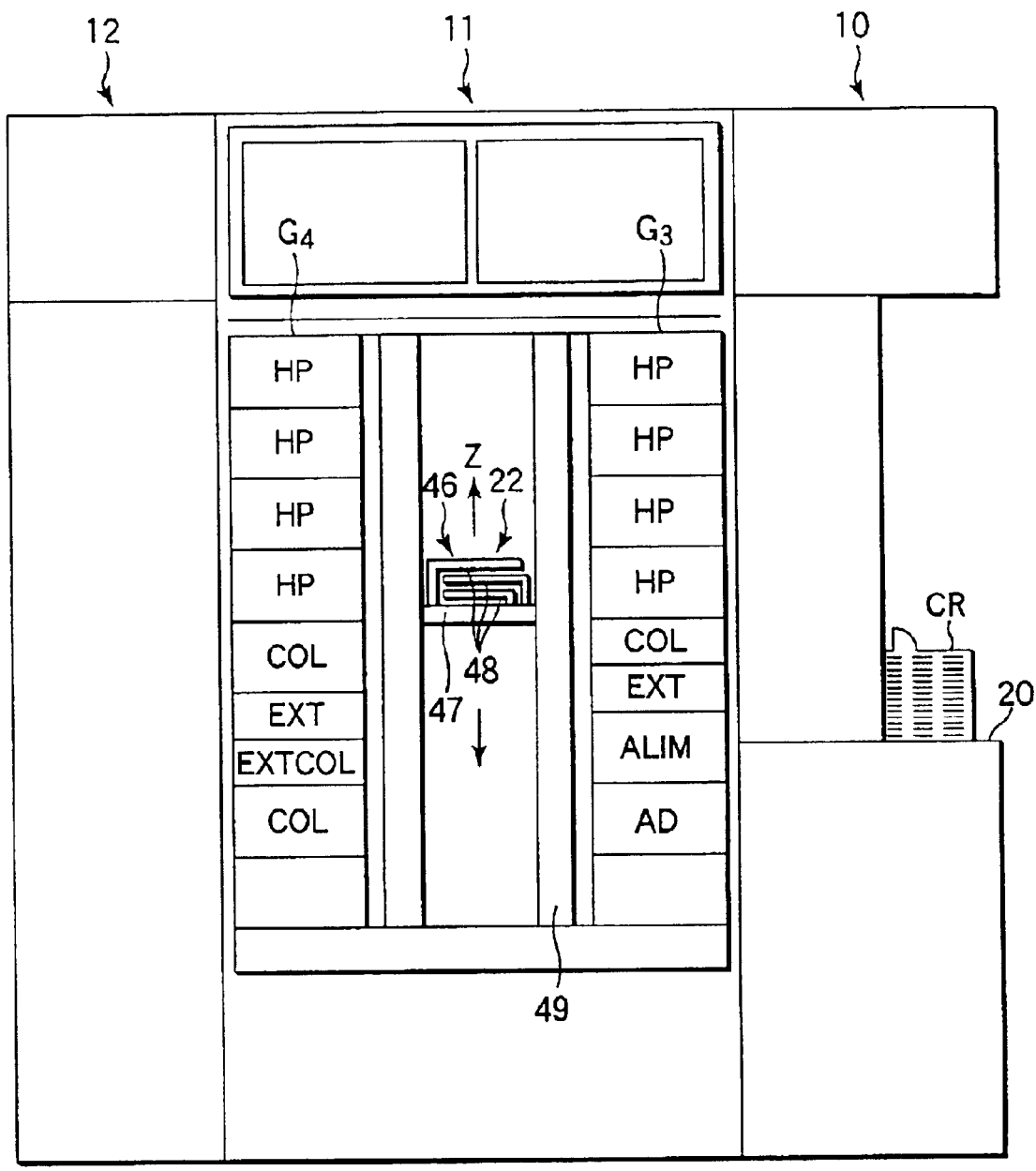
FIG. 3 is a back view schematically showing the construction of the resist coating and development system shown in FIG. 1.

FIG. 1 is a plan view schematically showing the construction of a resist coating and development system 1. Further, FIGS. 2 and 3 are a front view and a back view, respectively, showing the construction of the resist coating and development system 1 shown in FIG. 1. As shown in the drawing, the resist coating and development system 1 comprises a cassette station 10 acting as a transfer station, a process station 11 provided with a plurality of process units, and an interface section 12 arranged adjacent to the process station 11 for the delivery of a wafer W between the process station 11 and an exposure device (not shown).

The cassette station 10 is for transferring wafers W between a wafer cassette CR and the process station 11. For example, a plurality of wafers W, e.g., 25 wafers, housed in the wafer cassette CR are transferred from another system into and out of the resist coating and development system 1 via the cassette station 10.

As shown in FIG. 1, in the cassette station 10, a plurality of positioning projections 20a, i.e., four positioning projections 20a in the drawing, are arranged in the X-direction in the drawing on a table 20 on which the cassette CR is disposed. It is possible for the wafer cassettes CR to be disposed on the positions of the projections 20a in a manner to form a row such that the wafer delivery ports of the wafer cassettes CR are allowed to face the process station 11. In the wafer cassette CR, the wafers W are arranged in the vertical direction (Z-direction). Further, the cassette station 10 includes a wafer transfer mechanism 21 that is positioned between the table 20 and the process station 11.

The wafer transfer mechanism 21 includes a wafer transfer arm 21a movable in the cassette arranging direction (X-direction) and in the arranging direction of the wafers within the wafer cassette CR (Z-direction) such that the transfer arm 21a is capable of selectively gaining access to any of the wafer cassettes CR. Further, the wafer transfer arm 21a is swingable in the θ direction 1 so as to be capable of gaining access to the alignment unit (ALIM) and the extension unit (EXT) referred to herein later, which belong to a third process section $G_3$ on the side of the process station 11.

The process station 11 includes a plurality of process units for performing a series of steps in applying a resist coating-developing processing to the wafer W. These process units are arranged in prescribed positions to form a multi-stage structure, and the wafers W are processed one by one in these process units. As shown in FIG. 1, a transfer path 22a is formed in the central portion of the process station 11. A main wafer transfer mechanism 22 is arranged in the transfer path 22a and all the process units are arranged around the transfer path 22a. These plural process units are divided into a plurality of process sections each consisting of a plurality of process units arranged in the vertical direction (Z-direction) to form a multi-stage structure.

As shown in FIG. 3, the main wafer transfer mechanism 22 comprises a cylindrical support body 49 and a wafer transfer device 46 arranged movable in the vertical direction (Z-direction) inside the cylindrical support body 49. The cylindrical support body 49 can be rotated by a bit shown motor, and the wafer transfer device 46 can also be rotated integrally with the cylindrical support body 49. The wafer transfer device 46 includes a plurality of holding members 48 movable back and forth along a transfer base 47 so as to achieve the wafer delivery among the process units.

In this embodiment, first to fourth process sections $G_1$, $G_2$, $G_3$ and $G_4$ are arranged around the transfer path 22a, as shown in FIG. 1. Further, a fifth process section $G_5$ can be arranged, as required.

The first and second process sections $G_1$ and $G_2$ are arranged side by side on the front side of the system (lower side in FIG. 1). The third process section $G_3$ is arranged adjacent to the cassette station 10, and the fourth process section $G_4$ is arranged adjacent to the interface section 12. Further, the fifth process section $G_5$ can be arranged in the back portion.

In the first process section $G_1$, a developing unit (DEV) for developing an exposed resist, which is a spinner type process unit, is arranged above a resist coating unit (COT) for coating the wafer W with resist, which is also a spinner type process unit, to form a two stage vertical structure. In each of these spinner type process units, a predetermined processing is applied to the wafer W disposed on a spin chuck (not shown) within a coater cup (CP). Likewise, in the second process section $G_2$, a resist coating unit (COT) and a developing unit (DEV), which are two spinner type process units, are stacked one upon the other.

In the third process section $G_3$, a plurality of oven type process units for applying a prescribed processing to the wafer W disposed on a table SP are stacked one upon the other, as shown in FIG. 3. To be more specific, the third process section $G_3$ includes an adhesion unit (AD) for applying a so-called "hydrophobic treatment" for improving the fixing properties of the resist, an alignment unit (ALIM) for aligning the position of the wafer W, an extension unit (EXT) for transferring the wafer W, a cooling unit (COL) for cooling the wafer W, and four hot plate units (HP) for heating the wafer W before or after the exposure treatment and after the developing processing. These process units are stacked one upon the other in the order mentioned to form an eight-stage structure. Incidentally, it is possible to arrange a cooling unit (COL) in place of the alignment unit (ALIM) to allow the cooling unit (COL) to perform the aligning function.

The fourth process section $G_4$ also includes a plurality of oven type process units stacked one upon the other. To be more specific, the fourth process section $G_4$ includes a cooling unit (COL), an extension-cooling unit (EXTCOL) constituting a wafer delivery section equipped with a cooling plate, an extension unit (EXT), another cooling unit (COL), and four hot plate units (HP), which are stacked one upon the other in the order mentioned so as to form an eight-stage structure.

Where the fifth process section $G_5$ is arranged on the back side of the main wafer transfer mechanism 22, the fifth process section $G_5$ is movable sideward along a guide rail 25 as viewed from the main wafer transfer mechanism 22. It follows that, even where the fifth process section $G_5$ is arranged, the fifth process section $G_5$ can be slid along the guide rail 25 so as to ensure a free space behind the main wafer transfer mechanism 22. As a result, a maintenance operation can be applied easily to the main wafer transfer mechanism 22 from behind the main wafer transfer mechanism 22.

The interface section 12 is equal to the process station 11 in the length in the X-direction. As shown in FIGS. 1 and 2, a movable pick-up cassette CR and a stationary buffer cassette BR are stacked one upon the other in a front portion of the interface section 12. A peripheral exposure device 23 is arranged in a back portion of the interface section 12. Further, a wafer transfer mechanism 24 is arranged in the central portion of the interface section 12. The wafer transfer mechanism 24 includes a wafer transfer arm 24a, which is movable both in the X-direction and the Z-direction so as to gain access to the cassettes CR, BR and the peripheral exposure device 23.

Incidentally, the wafer transfer arm 24a is swingable in the θ direction so as to gain access to the extension unit (EXT) belonging to the fourth process section $G_4$ of the process station 11 and to a wafer delivery table (not shown) on the side of the adjacent exposure device.

In the resist coating and development system 1 of the construction described above, the wafer transfer arm 21a of the wafer transfer mechanism 21 gains access to the wafer cassette CR disposed on the cassette table 20 and housing unprocessed wafers in the cassette station 10. Then, the unprocessed wafers W are taken out one by one from the wafer cassette CR so as to be transferred into the extension unit (EXT) belonging to the third process section G$_3$.

The wafer W is transferred from the extension unit (EXT) into the alignment unit (ALIM) belonging to the third process section G$_3$ by the wafer transfer device 46 of the main wafer transfer mechanism 22 so as to be aligned and, then, further transferred into the adhesion unit (AD) for receiving a hydrophobic treatment (HMDS treatment) for improving the fixing properties of the resist. Since the hydrophobic treatment is accompanied by heating, the wafer W is then transferred into the cooling unit (COL) by the wafer transfer device 46 so as to be cooled.

Depending on the kind of the resist used, it is possible to transfer the wafer W directly into the resist coating unit (COT) without applying the HMDS treatment to the wafer W. For example, the wafer W is transferred directly into the resist coating unit (COT) in the case of using a polyimide series resist.

The wafer W cooled in the cooling unit (COL) after completion of the processing in the adhesion unit (AD) or the wafer W that was not processed in the adhesion unit (AD) is then transferred into the resist coating unit (COT) by the wafer transfer device 46 so as to be coated with resist and, thus, to form a coated film. The wafer W after completion of the coating treatment is pre-baked in the hot plate unit (HP) in any of the third and fourth process sections G$_3$ and G$_4$ and, then, cooled in the cooling unit in any of the third and fourth process sections G$_3$ and G$_4$.

The cooled wafer W is transferred into the alignment unit (ALIM) included in the third process section G$_3$ so as to be aligned and, then, is further transferred into the interface section 12 through the extension unit (EXT) included in the fourth process section G$_4$.

The wafer W is subjected to a peripheral exposure by the peripheral exposure device 23 in the interface section 12 so as to remove the excessive resist and, then, transferred into the exposure device (not shown) arranged adjacent to the interface section 12. In the exposure device, the resist film formed on the wafer W is subjected to an exposure treatment at a prescribed pattern.

The exposed wafer W is brought back again into the interface section 12 and transferred into the extension unit (EXT) belonging to the fourth process section G$_4$ by the wafer transfer mechanism 24. Further, the wafer W is transferred by the wafer transfer device 46 into any of the hot plate units (HP) so as to be subjected to a post-exposure processing and, then, cooled in the cooling unit (COL).

Then, the wafer W is transferred into the developing unit (DEV) for the development of the exposed pattern. After the development, the wafer W is transferred into any of the hot plate units (HP) so as to be subjected to a post-baking treatment and, then, cooled in the cooling unit (COL). After completion of the series of processing described above, the wafer W is brought back to the cassette station 10 through the extension unit (EXT) belonging to the third process section G$_3$ so as to be housed in any of the wafer cassettes CR.

Figure 4:
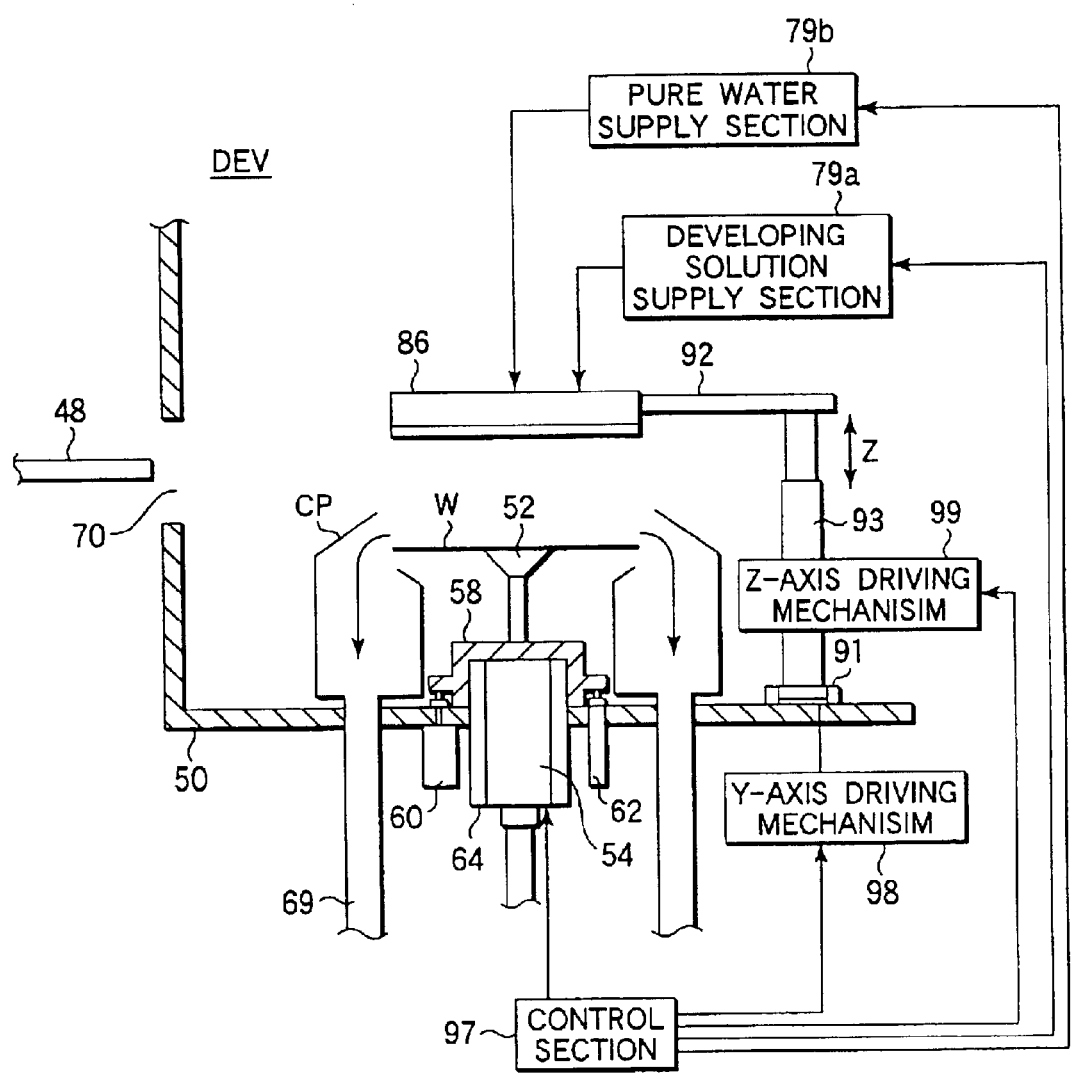
FIG. 4 is a cross sectional view schematically showing the construction of a developing unit (DEV) mounted to the resist coating and development system.
Figure 5:
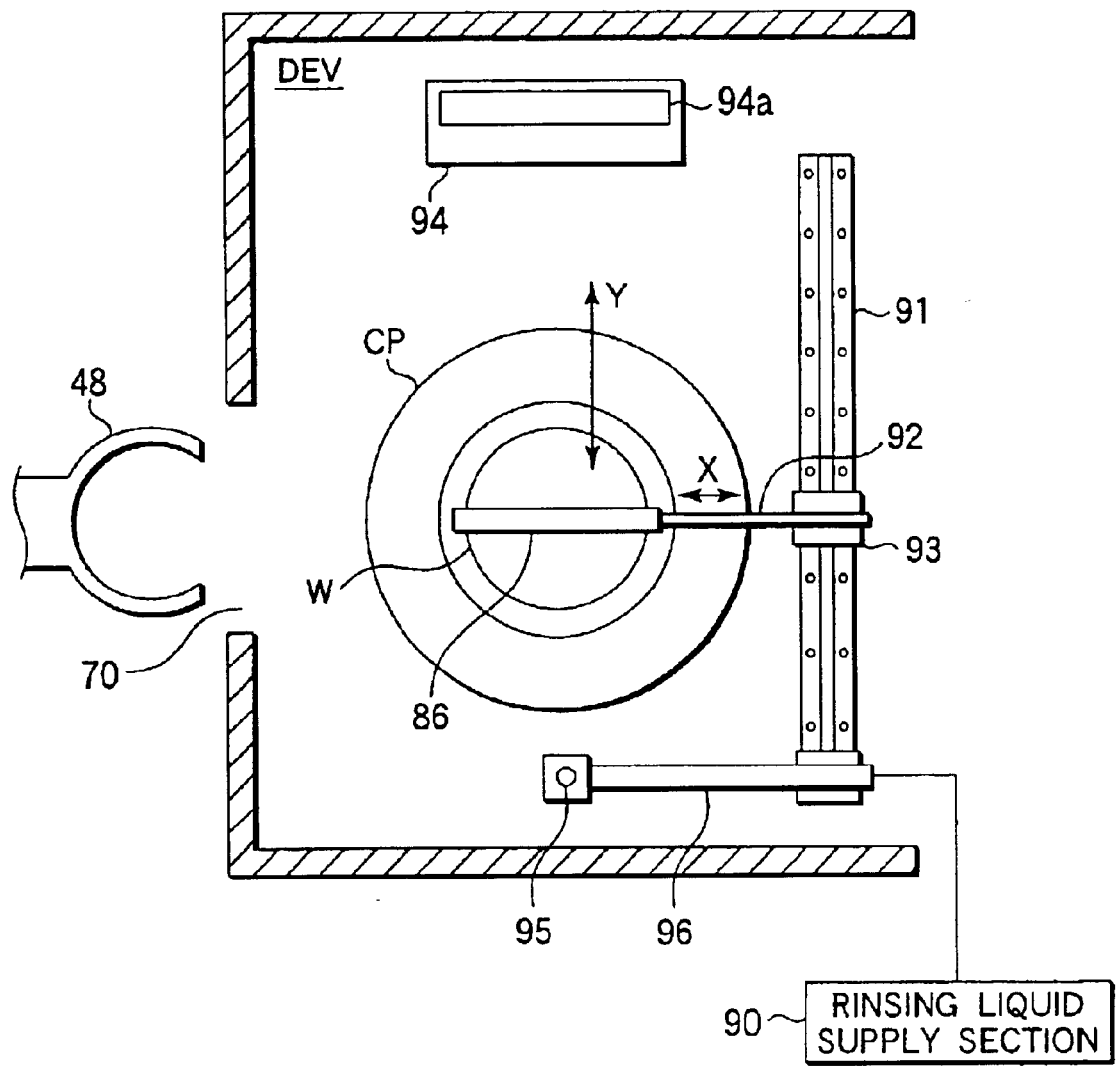
FIG. 5 is a plan view schematically showing the construction of the developing unit (DEV)

The developing unit (DEV) referred to above will now be described in detail. Specifically, FIG. 4 is a cross sectional view schematically showing the construction of the developing unit (DEV), and FIG. 5 is a plan view schematically showing the construction of the developing unit (DEV) shown in FIG. 4. As shown in the drawing, an annular coater cup (CP) is arranged in the central portion of the developing unit (DEV), and a spin chuck 52 is arranged inside the coater cup (CP). The spin chuck 52 is rotated by a driving motor 54 with the wafer W held by the spin chuck 52 by the vacuum suction. The driving motor 54 is arranged vertically movable in the opening of a unit bottom plate 50, and is joined to a vertical driving means 60 formed of, for example, an air cylinder and a vertical guide means 62 via a cap-shaped flange member 58 made of, for example, aluminum. A cylindrical cooling jacket 64 made of, for example, a stainless steel (SUS) is mounted to the side surface of the driving motor 54, and the flange member 58 is mounted to cover the upper half portion of the cooling jacket 64.

During the supplying operation of a developing solution, the lower end of the flange member 58 is brought into a tight contact with the unit bottom plate 50 in the vicinity of the outer circumferential region of the opening of the unit bottom plate 50, thereby hermetically closing the inner space of the unit. When the wafer W is transferred between the spin chuck 52 and the main wafer transfer mechanism 22, the vertical driving means 60 moves upward the driving motor 54 and the spin chuck 52 so as to allow the lower end of the flange member 58 to float from the unit bottom plate 50. Incidentally, a window 70 through which a holding member 48 enters the casing is formed in the casing of the developing unit (DEV).

Figure 6:
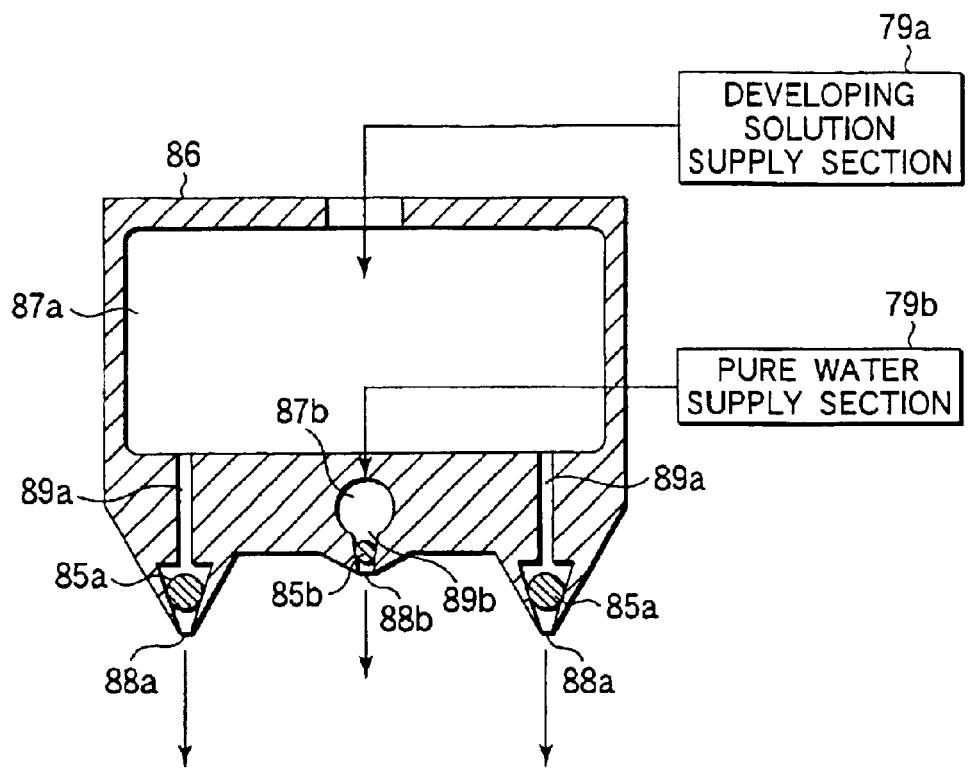
FIG. 6 is a cross sectional view schematically showing the construction of a developing solution spurting nozzle, which is mounted to the developing unit(DEV), according to one embodiment of the present invention.

A developing solution spurting nozzle 86 for supplying a developing solution onto the surface of the wafer W is long and is arranged horizontal in its longitudinal direction (X-direction). A developing solution and a pure water are separately supplied from a developing solution supply section 79a and a pure water supply section 79b, respectively, into the developing solution spurting nozzle 86. FIG. 6 is a cross sectional view schematically showing the construction of the developing solution spurting nozzle 86. As shown in the drawing, the developing solution spurting nozzle 86 includes a developing solution reservoir 87a capable of storing the developing solution and extending in the X-direction and two communicating passageways 89a communicating with the developing solution reservoir 87a. One end of each of the communicating passageways 89a forms a slit type spurting port 88a for spurting the developing solution. Further, a pure water reservoir 87b capable of storing a pure water is formed separately from the developing solution reservoir 87a. To be more specific, the pure water reservoir 87b is formed between the two communicating passageways 89a. It should be noted that one end of a communicating passageway 89b communicating with the pure water reservoir 87b forms a slit type spurting port 88b for spurting the pure water.

A prescribed developing solution is supplied from the developing solution supply section 79a into the developing solution reservoir 87a. The developing solution thus supplied into the developing solution reservoir 87a is spurted from the slit type spurting port 88a formed at the lower end of each of the communicating passageways 89a through each of the communicating passageways 89a. A buffer rod 85a, e.g., a quartz rod or a rod of a porous body, is arranged in the vicinity of the slit type spurting port 88a within the communicating passageway 89a. The buffer rod 85a permits the spurting pressure of the developing solution spurted from the slit type spurting port 88a to be made uniform in the longitudinal direction of the developing solution spurting nozzle 86 and also permits preventing the leakage of the developing solution from the slit type spurting port 88a. Further, a buffer rod 85b equal in its function to the buffer rod 85*a* is also arranged in the vicinity of the slit type spurting port 88*b* within the communicating passageway 89*b*.

Incidentally, where a prescribed amount of the developing solution is spurted against the wafer W in a prescribed time, the spurting pressure of the developing solution is increased in the case where a single developing solution spurting nozzle is equipped with only one slit type spurting port, giving rise to the problem that, when the developing solution is supplied onto the wafer W to form a puddle of the developing solution, the amount of the developing solution dropping from the wafer W is increased. Further, where the wafer W supplied with the developing solution is further supplied with the developing solution, the developing solution supplied first to the wafer W is likely to be stirred. By contraries, if the width of the slit spurting port is increased, it is difficult to achieve a stable spurting of the developing solution, though the spurting pressure is certainly lowered. Under the circumstances, the developing solution spurting nozzle 86 is provided with the two slit type spurting ports 88*a* so as to make it possible to supply a prescribed amount of the developing solution onto the wafer W while maintaining a low spurting pressure of the developing solution from a single slit type spurting port 88*a*.

Figure 7:
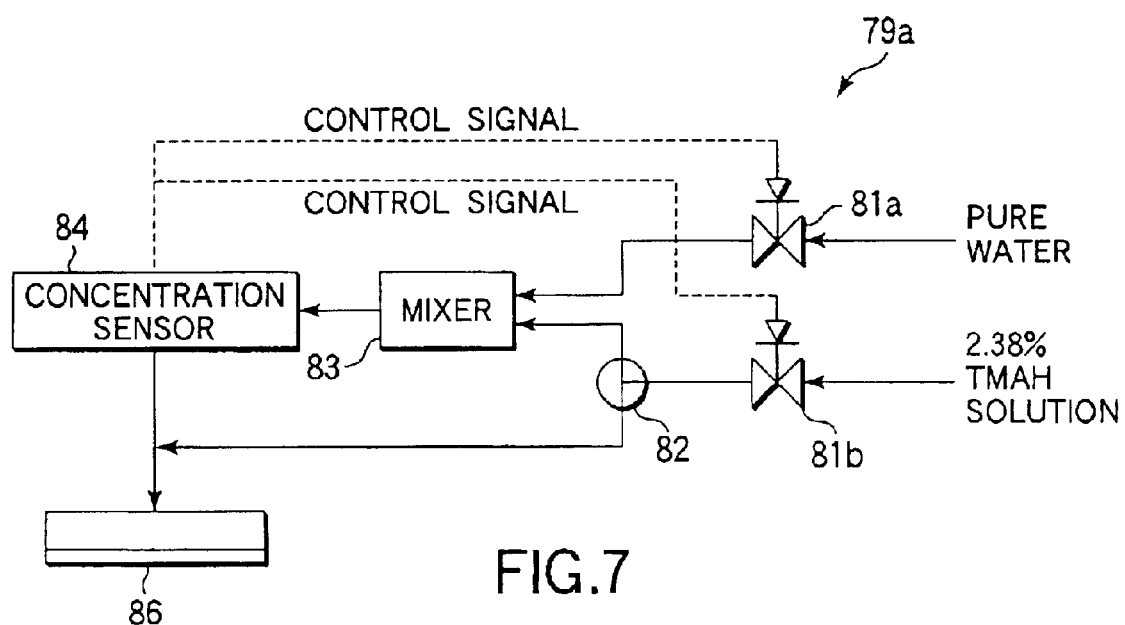
FIG. 7 schematically shows the construction of a developing solution supply section for supplying a developing solution into the developing unit (DEV)

FIG. 7 schematically shows the construction of the developing solution supply section 79*a*. As shown in the drawing, it is possible to supply the developing solution adjusted at a prescribed concentration from the developing solution supply section 79*a* into the developing solution spurting nozzle 86. To be more specific, a pure water is supplied from a pure water storing source (not shown) into the mixer 83 through a flow rate control means such as an electromagnetic valve 81*a*. Further, a TMAH developing solution having a prescribed concentration, e.g., 2.38%, is also supplied from a developing solution storing source (not shown) into the mixer 83 through an electromagnetic valve 81*b*. These pure water and the developing solution are uniformly mixed within the mixer 83, and the mixed solution is supplied into the developing solution spurting nozzle 86.

A concentration sensor 84 for monitoring the concentration of the developing solution supplied through the mixer 83 into the developing solution spurting nozzle 86 is mounted to the developing solution supply section 79*a*. A control signal is supplied from the concentration sensor 84 into the electromagnetic valves 81*a* and 81*b* so as to control the concentration of the developing solution at a prescribed value. It is possible to prepare a developing solution having a desired concentration by controlling the degrees of opening of the electromagnetic valves 81*a*, 81*b* so as to control the flow rate of each of the pure water and the developing solution. The supply route of the developing solution passing through the mixer 83 is used in the case where the developing solution having a concentration of 2.38% is diluted before the developing solution is spurted against the wafer W. Incidentally, a three-way valve 82 is arranged in the fluid passageway between the electromagnetic valve 81*b* and the mixer 83. It is possible to supply the developing solution having a concentration of 2.38% as it is into the developing solution spurting nozzle 86 by controlling the operation of the three-way valve 82.

A pure water is supplied from the pure water supply section 79*b* into the pure water reservoir 87*b* and is spurted from the single slit type spurting port 88*b*. Incidentally, it is possible to construct the system such that the developing solution having a prescribed concentration is supplied from the pure water supply section 79*b*.

The developing solution spurting nozzle 86 capable of spurting a developing solution having a prescribed concentration and a pure water is detachably mounted to the tip portion of nozzle scan arm 92, as shown in FIGS. 4 and 5. The nozzle scan arm 92 is mounted to the upper end portion of a vertical support member 93 movable in a horizontal direction along a guide rail 91 arranged to extend in one direction (Y-direction) on the unit bottom plate 50, and can be moved in the Y-direction together with the vertical support member 93 by a Y-axis driving mechanism 98. Further, the developing solution spurting nozzle 86 can be moved in the vertical direction (Z-direction) by a Z-axis driving mechanism 99.

The developing solution can be supplied by, for example, allowing the Y-axis driving mechanism 98 to move the developing solution spurting nozzle 86 along the guide rail 91 in a manner to scan over the wafer W while allowing the developing solution spurting nozzle 86 to spurt the developing solution in the form of a band onto the wafer W. Alternatively, it is also possible to move the developing solution spurting nozzle 86 to the position where the longitudinal direction of the developing solution spurting nozzle 86 overlaps with the diameter of the wafer W, e.g., the position shown in FIG. 5. Under this condition, the wafer W is rotated by at least a half of one complete rotation while spurting the developing solution against the wafer W so as to achieve a desired supplying operation.

After supplying of the developing solution, the developing solution spurting nozzle 86 is retreated to a nozzle waiting section 94 shown in FIG. 5. A nozzle cleaning mechanism (nozzle bath) 94*a* for cleaning the slit type spurting ports 88*a*, 88*b* of the developing solution spurting nozzle 86 is arranged in the nozzle waiting section 94.

The developing unit (DEV) includes a rinse nozzle 95 for spurting a rinsing liquid against the wafer W. The rinsing liquid is supplied from a rinsing liquid supply section 90 into the rinse nozzle 95. The rinse nozzle 95 is mounted to the tip of a nozzle scan arm 96 arranged movable in the Y-direction along the guide rail 91. After the development using a developing solution, the rinse nozzle 95 is moved above the wafer W so as to spurt a rinsing liquid onto the wafer W.

A pure water, which is a solvent of the developing solution, is suitably used as the rinsing liquid. The shape of the rinse nozzle 95 is not particularly limited. It is possible to use, for example, a pipe-like straight nozzle as the rinse nozzle 95. The developing solution and the rising liquid dropping from the wafer W or centrifugally removed from the wafer W is released to the outside through a drain 69. Incidentally, it is possible to carry out the rinsing treatment by using a pure water spurted from the slit type spurting port 88*b* of the developing solution spurting nozzle 86. The leakage of the developing solution from the slit type spurting port 88*a* is suppressed by the buffer rod 85*a*. However, it is desirable to carry out finally the rinsing treatment by using the rinse nozzle 95 in order to avoid without fail the liquid leakage from the slit type spurting port 88*a* during the rinsing treatment so as to improve the accuracy of the rinsing treatment.

The operation of the driving system of the developing unit (DEV) is controlled by a control section 97. To be more specific, the driving motor 54, the Y-axis driving mechanism 98 and the Z-axis driving mechanism 99 are driven and controlled by an instruction generated from the control section 97. Further, the developing solution supply section 79*a*, the pure water supply section 79*b* and the rinsing liquid supply section 90 are controlled together with the operation of the driving system by a signal generated from the control section 97.

Various methods for the developing processing, which are carried out in accordance with the characteristics of the resist film relative to the developing solution by using the developing unit (DEV), will now be described. In the conventional method for the developing processing, used was a TMAH developing solution having the concentration fixed to, for example, 2.38%. However, since it is possible to prepare a developing solution having an optional concentration in the developing solution supply section 79a, it is possible to prepare a developing solution having a suitable concentration in accordance with the characteristics of the resist film relative to the developing solution every time the developing processing is carried out. It follows that it is possible to obtain a developed pattern (circuit pattern) excellent in, for example, the accuracy of the shape.

Figure 8:
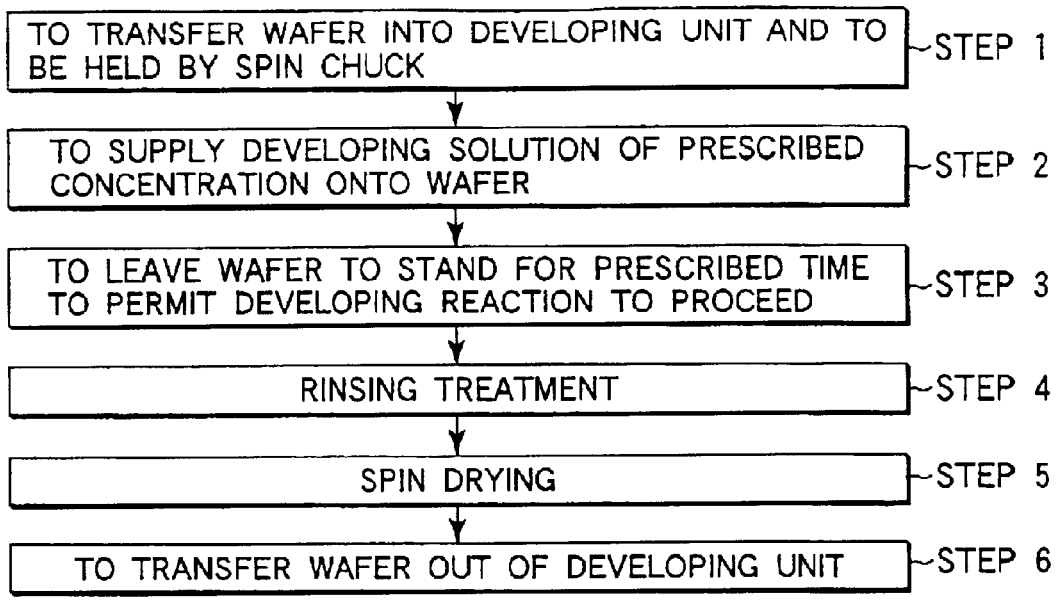
FIG. 8 is a flow chart showing a method for a developing processing in which a developing solution is adjusted at a prescribed concentration for use for the developing processing.

FIG. 8 is a flow chart showing a method for the developing processing using a developing solution having the concentration adjusted in accordance with the characteristics of the resist film relative to the developing solution. Specifically, the wafer W having a prescribed circuit pattern subjected to an exposure treatment using, for example, a KrF ray, ArF ray or a $F_2$ ray, to a post-exposure baking treatment, and to a cooling processing is transferred by the holding member 48 of the main wafer transfer mechanism 22 onto a position right above the coater cup (CP) and, then, held by vacuum suction on the spin chuck 52 moved upward by the vertical driving means 60 (step 1).

Then, the developing solution spurting nozzle 86 is positioned to face one end in the Y-direction of the wafer W. Under this condition, the developing solution spurting nozzle 86 is moved by the Y-axis driving mechanism 98 to the other end in the Y-direction of the wafer W while allowing the developing solution spurting nozzle 86 to spurt in the form of a band a TMAH developing solution having a prescribed concentration, e.g., 2.0%, which is prepared by mixing a pure water with a TMAH developing solution having a concentration of 2.38% in the developing solution supply section 79a, so as to supply a developing solution of a prescribed concentration onto the wafer W (step 2). After the wafer W is supplied with the developing solution of a prescribed concentration, the wafer W is left to stand for a prescribed time so as to permit a developing reaction to proceed (step 3).

In the next step, the developing solution supply nozzle 86 is retreated into the nozzle waiting section 94 so as to be housed in the nozzle waiting section 94 and to be cleaned. Then, the rinse nozzle 95 is moved to a region above the wafer W a prescribed time later, and the spin chuck 52 is rotated at a prescribed rotating speed while allowing the rinse nozzle 95 to spurt a pure water (rinsing liquid) so as to centrifugally remove the developing solution on the wafer W together with the rinsing liquid (step 4), followed by rotating the spin chuck 52 at a higher rotating speed under the state that the rinse nozzle 95 ceases to spurt the rinsing liquid, thereby drying the wafer W, i.e., spin drying (step 5). The dried wafer W is transferred out of the developing unit (DEV) by the procedure opposite to that in the case of transferring the wafer W into the developing unit (DEV) (step 6). Then, the wafer W is transferred into a prescribed hot plate unit (HP) so as to be subjected to a thermal drying treatment.

Figure 9:
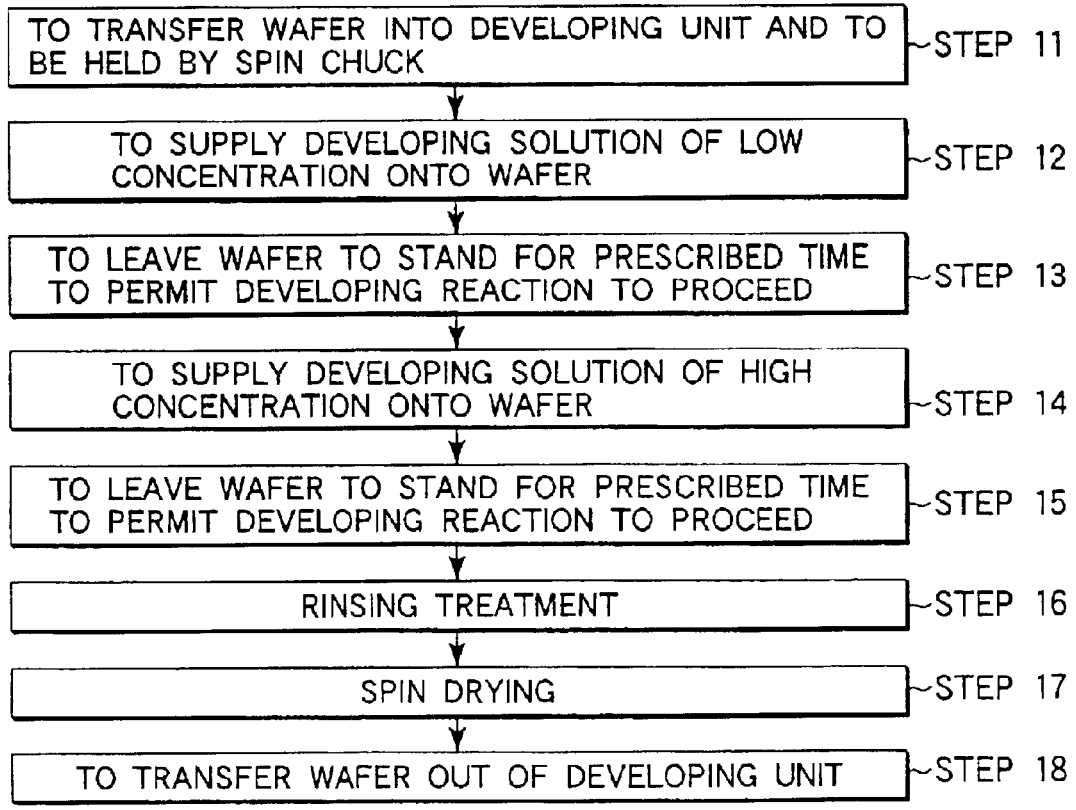
FIG. 9 is a flow chart showing a method for a developing processing of a wafer on which is formed a resist film having a high dissolving rate in a developing solution.

FIG. 9 is a flow chart exemplifying the method for the developing processing of the wafer W on which is formed a resist film having a high dissolving rate in a developing solution, e.g., a resist film having a trade name of UV6. In this case, the wafer W is held by the spin chuck 52 (step 11) and, then, a TMAH developing solution having a low concentration, e.g., 1.55%, which is prepared by mixing a pure water with a TMAH developing solution having a concentration of 2.38%, is supplied from the developing solution spurting nozzle 86 onto the wafer W (step 12). It is possible to scan the developing solution spurting nozzle 86 a plurality of times so as to supply the developing solution of a low concentration a plurality of times onto the wafer W. After the developing solution of a low concentration is supplied onto the wafer W, the wafer W is left to stand for a prescribed time so as to permit a developing reaction to proceed (step 13).

In the next step, a TMAH developing solution of a high concentration, e.g., 2.38%, is spurted again in the form of a band from the developing solution spurting nozzle 86 so as to further supply the developing solution of a high concentration onto the wafer W (step 14). In this case, the developing solution of the high concentration is supplied onto the wafer W while the developing solution of the low concentration, which was supplied previously onto the wafer W, is being pushed out in the moving direction of the developing solution spurting nozzle 86. It is possible to scan the developing solution spurting nozzle 86 a plurality of times so as to supply the developing solution of the high concentration a plurality of times onto the wafer W.

The wafer W coated with the developing solution of the high concentration is left to stand for a prescribed time so as to permit a developing reaction to proceed (step 15). If the processes for steps 12 to 15 are carried out with the wafer W held stationary without rotating the wafer W, the dissolved product of the resist film is not stirred so as to make it possible to suppress the generation of the traces derived from the movement of the dissolved product. After step 15, the rinsing treatment (step 16), the spin drying (step 17), and the transfer of the wafer W out of the developing unit (step 18) are carried out as in steps 4 to 6 described previously with reference to FIG. 8.

In the method for carrying out the developing reaction by supplying a developing solution onto the stationary wafer W as described above, the developing solution tends to be supplied in a large amount to the central portion of the wafer W, with the result that the developing reaction proceeds promptly in the central portion of the wafer so as to cause the line width of the circuit pattern to be rendered smaller in the central portion than in the peripheral portion. This tendency is rendered prominent in the case where the dissolving rate of the resist film in the developing solution is high.

Figure 10:
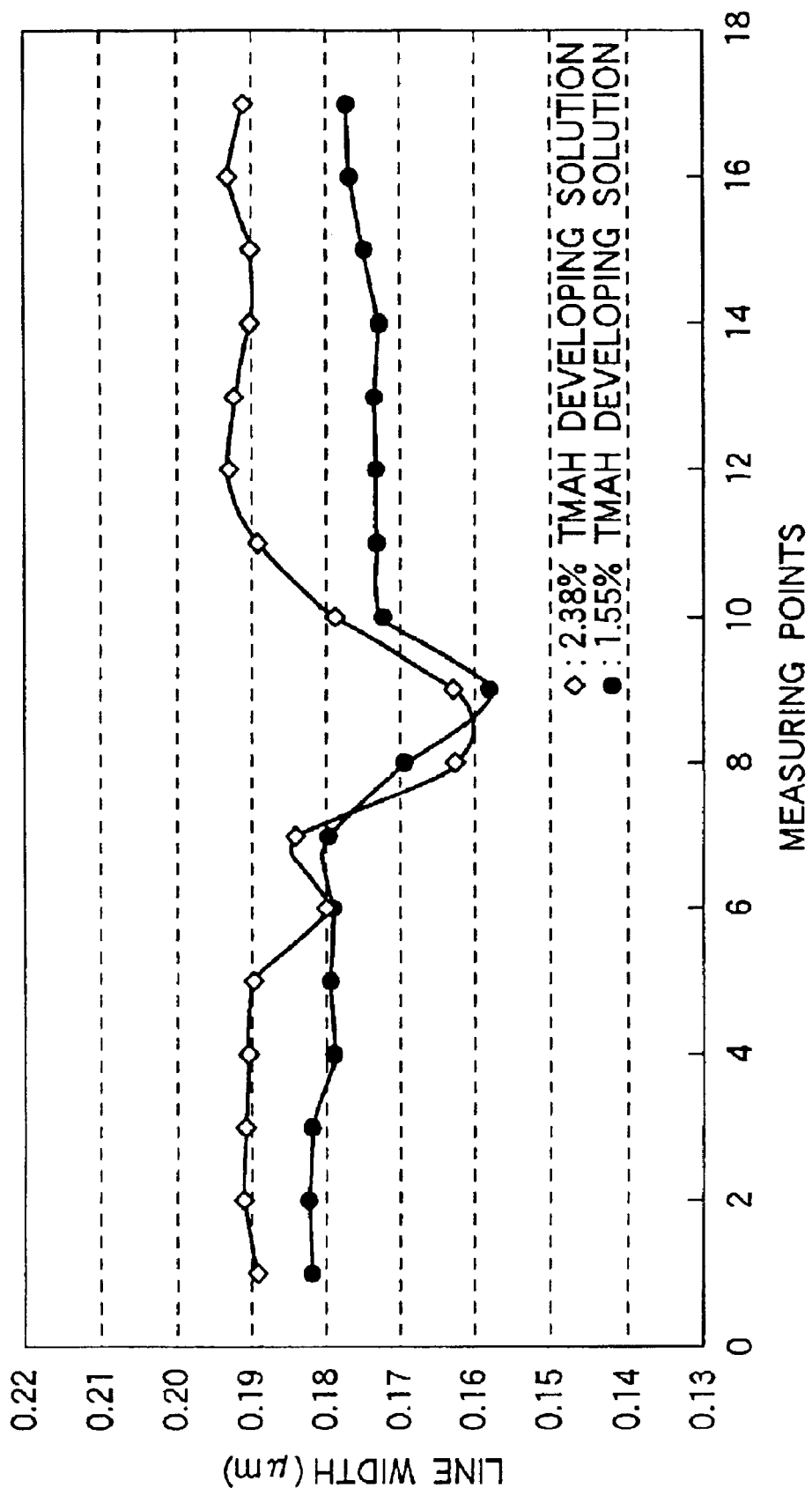
FIG. 10 is a graph showing the nonuniformity in the line width on a wafer surface in the case where developing solutions differing from each other in concentration are used for the developing processing.

For example, FIG. 10 is a graph showing the nonuniformity of the line width, which is obtained in the case where the developing reaction is carried out by supplying TMAH developing solutions having two different concentrations of 1.55% and 2.38% onto the wafer W. It should be noted that the diameter of the wafer W was equally divided so as to provide the 17 measuring points plotted on the abscissa in the graph of FIG. 10, and these measuring points are sequentially numbered from one end of the wafer W toward the other end. In other words, the region in the vicinity of the measuring point 9 represents the central portion of the wafer W. Further, the line width in each of the measuring points is plotted on the ordinate of the graph. In this case, the line width of 0.18 μm provides the target value of the development.

As apparent from the experimental data given in the graph of FIG. 10, the difference in the line width between the peripheral portion and the central portion of the wafer W is large in the case of supplying a developing solution of a high concentration (2.38%) onto the wafer W. On the other hand, the difference in the line width between the peripheral portion and the central portion of the wafer W is rendered small in the case of supplying a developing solution of a low concentration (1.55%) onto the wafer W. It follows that it is possible to use exclusively a developing solution of a low concentration for carrying out the developing reaction. In this case, however, the developing reaction time is rendered long so as to lower the through-put. Under the circumstances, a developing solution of a low concentration is used in the initial stage of the developing reaction and, a prescribed time later, a developing solution of a high concentration is used for carrying out the developing reaction for a short time in the method of the present invention for the developing processing, as shown in the flow chart of FIG. 9 referred to previously. It follows that it is possible to carry out the developing processing with an improved through-put while suppressing the nonuniformity of the line width that takes place in the initial period of the developing processing.

Figure 11:
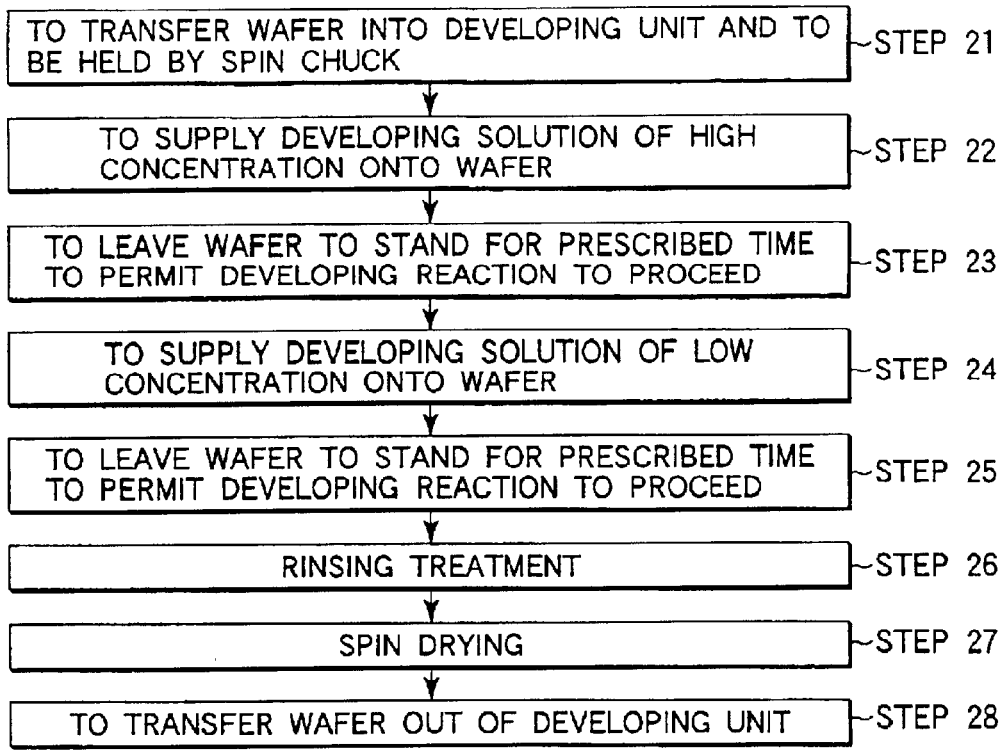
FIG. 11 is a flow chart showing a method for a developing processing of a wafer on which is formed a resist film having a low dissolving rate in a developing solution.

FIG. 11 is a flow chart exemplifying a method for the developing processing of the wafer W on which is formed a resist film having a low dissolving rate in a developing solution. In this case, the wafer W is held by the spin chuck 52 (step 21), followed by supplying a developing solution onto the wafer W held by the spin chuck 52. It should be noted that, if a developing solution of a low concentration is supplied onto the wafer W in this step, the difference in time required for supplying the developing solution onto the wafer W appears as a difference in CD after the development. Therefore, a developing solution of a high concentration, e.g., 2.38%, is supplied onto the wafer W in the present invention (step 22), and the wafer W receiving the developing solution is left to stand for a prescribed time (step 23). The particular process makes it possible to suppress the nonuniformity in CD.

After step 23, a developing solution having a concentration lower than that of the developing solution of a high concentration supplied previously onto the wafer W is supplied onto the wafer W (step 24), and the wafer W receiving the developing solution of the low concentration is left to stand for a prescribed time (step 25). It is possible to set the concentration of the developing solution having a low concentration at, for example, 0.5 to 2.0%. It is possible to carry out the developing processing conforming with a desired CD by allowing the developing reaction to proceed slowly in the latter stage of the developing processing.

After the prescribed time for the developing reaction has elapsed, the series of processing including the rinsing treatment (step 26), the spin drying (step 27), and the transfer of the wafer W out of the developing unit (DEV) (step 28) are carried out as in steps 4 to 6 described previously in conjunction with FIG. 8.

Figure 12:
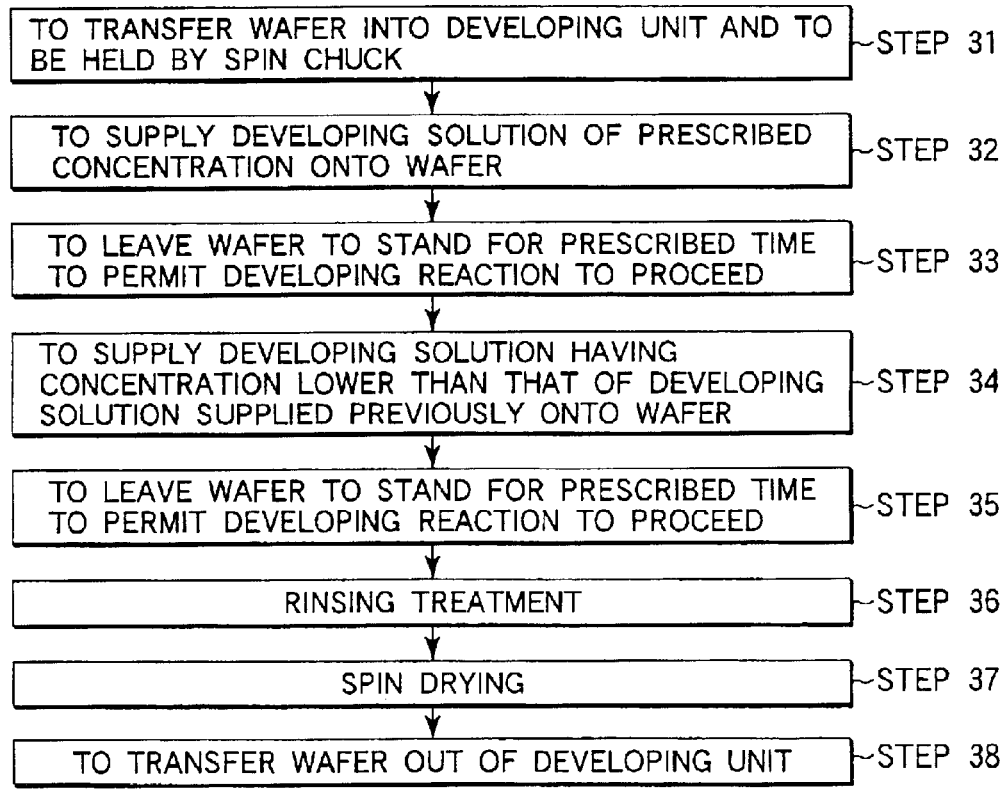
FIG. 12 is a flow chart showing a method for a developing processing of a wafer on which is formed a resist film small in the difference in solubility in the developing solution between the exposed portion and the unexposed portion.

FIG. 12 is a flow chart exemplifying a method for the developing processing of a wafer W on which is formed a resist film low in contrast, i.e., a resist film having a small difference in the solubility in the developing solution between the exposed portion and the unexposed portion. In this case, the wafer W is held by the spin chuck 52 (step 31), followed by supplying a developing solution having a prescribed concentration onto the wafer W (step 32) and subsequently leaving the wafer W receiving the developing solution to stand for a prescribed time (step 33). The concentration of the developing solution used in steps 32 and 33 is set appropriately in view of the through-put. For example, it is possible to set the concentration of the developing solution at 1.5% to 2.38%.

After the step 33, a developing solution having a concentration lower than that of the developing solution supplied previously onto the wafer W is supplied onto the wafer W (step 34), and the developing solution thus supplied onto the wafer W is held for a prescribed time (step 35). Where a positive resist film low in contrast is formed on the wafer W, the unexposed portion of the resist film is gradually dissolved under the influence of the diffracted light in the exposure step, with the result that it is difficult to obtain a pattern satisfactory in the accuracy of the shape. However, the dissolution of the unexposed portion can be prevented by using a developing solution of a low concentration in the latter stage of the developing reaction so as to lower the rate of the developing reaction. As a result, it is possible to form an excellent circuit pattern.

After the prescribed time for the developing reaction has elapsed, the series of processes including the rinsing treatment (step 36), the spin drying (step 37), and the transfer of the wafer W out of the developing unit (DEV) (step 38) are carried out as in steps 4 to 6 described previously in conjunction with FIG. 8.

Figure 13:
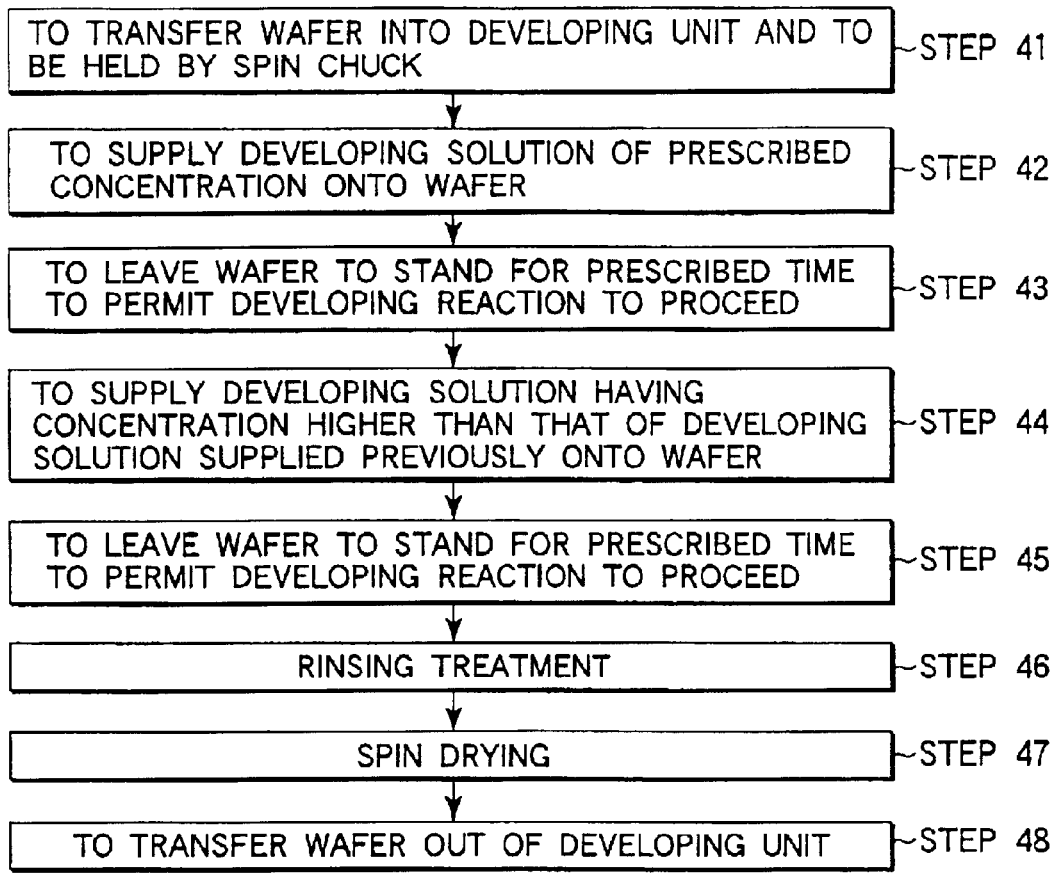
FIG. 13 is a flow chart showing a method for a developing processing of a wafer on which is formed a resist film which easily absorbs water contained in the developing solution so as to be swollen.

FIG. 13 is a flow chart exemplifying a method for the developing processing of the wafer W on which is formed a resist film that easily absorbs water contained in the developing solution so as to be swollen. In this case, the wafer W is held by the spin chuck 52 (step 41), followed by supplying a developing solution having a prescribed concentration onto the wafer W (step 42) and subsequently leaving the wafer W receiving the developing solution to stand for a prescribed time (step 43). The concentration of the developing solution used in steps 42 and 43 is set appropriately in view of the through-put, the dissolving rate of the resist film in the developing solution, etc. For example, it is possible to set the concentration of the developing solution at 0.5% to 2.0%.

It should be noted that, if the resist film absorbs water contained in the developing solution during the process of the developing reaction so as to be swollen, the accuracy in the shape of the circuit pattern formed is lowered. For example, the line width of the resist pattern remaining after the developing processing is increased, and the wall surface of the resist pattern is roughened so as to lower the accuracy in the shape of the circuit pattern formed. Under the circumstances, in order to suppress the water absorption of the resist film from the developing solution, a developing solution having a concentration higher than that of the developing solution supplied previously onto the wafer W is supplied again onto the wafer W after step 43 (step 44), and the wafer W receiving the developing solution of the high concentration is retained for a prescribed time (step 45). The particular process makes it possible to suppress the swelling of the resist film. Further, in the case where the positive resist is used, even if the resist film has already been swollen, the swollen portion of the resist film is dissolved in the developing solution of the high concentration because the swollen portion is rendered ready to be dissolved in the developing solution under the influence of the diffracted light in the step of the exposure. It follows that it is possible to obtain a circuit pattern having a desired accuracy of the shape.

Figure 14:
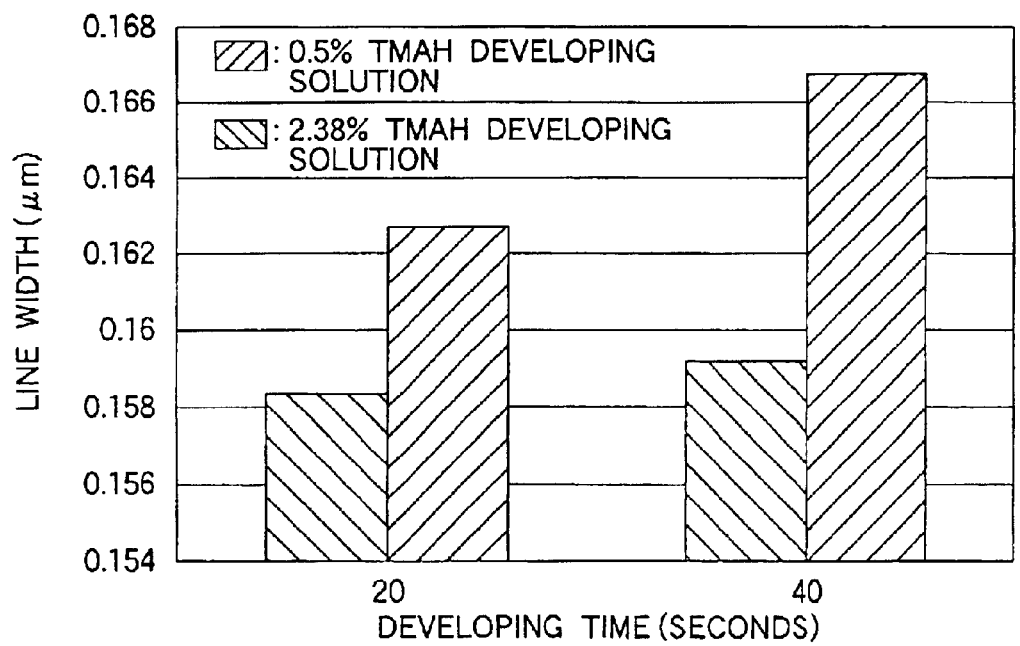
FIG. 14 is a graph showing the relationship between the change in the line width caused by the swelling of the resist film and the concentration of the developing solution.

FIG. 14 is a graph showing the relationship between the change in the line width of the resist pattern caused by the swelling of the resist film and the concentration of the developing solution. The graph of FIG. 14 shows the line width, covering the case where the pattern exposed to light by using the same mask was developed for 20 seconds or 40 seconds by using a TMAH developing solution having a concentration of 2.38% or a TMAH developing solution having a concentration of 0.5%. In the case of using the TMAH developing solution having a concentration of 2.38%, the change in the developing time scarcely brought about a change in the line width. However, in the case of using the TMAH developing solution having a concentration of 0.5%, generated was a so-called "thickening phenomenon" that the line width was increased with increase in the developing time. The thickening phenomenon is brought about because the swelling rate of the resist film is higher than the developing rate. In the case of using a resist film bringing about the thickening phenomenon, it is possible to suppress the swelling of the resist film by performing the developing processing using a developing solution having a relatively high concentration in the latter stage of the developing processing so as to make it possible to obtain a circuit pattern having an appropriate line width.

After the step 45, the series of processes including the rinsing treatment (step 46), the spin drying (step 47), and the transfer of the wafer W out of the developing unit (DEV) (step 48) are carried out as in steps 4 to 6 described previously in conjunction with FIG. 8.

A method for the developing processing, which permits improving the CD uniformity on the surface of the wafer W, will now be described. In the conventional method in which the developing processing is carried out by supplying a single kind of a developing solution only once onto the stationary wafer W, the dissolved product remains in a high concentration at the completion of the developing reaction in the portion where the resist film was dissolved, with the result that the state of equilibrium between the dissolved product and the TMAH developing solution is collapsed in the latter stage of the development so as to bring about a problem that a partial change in CD is generated. Further, the distribution of CD under the influence of the dissolved product of a high concentration is changed depending on the aperture rate of the mask. Further, if the developing solution is removed by rotating the semiconductor wafer substantially simultaneously with the start-up of the supply of the rinsing liquid after the developing reaction, traces are left on the wafer W when the dissolved product of the high concentration is centrifugally moved on the surface of the wafer W so as to degrade the quality of the wafer W.

Figure 15:
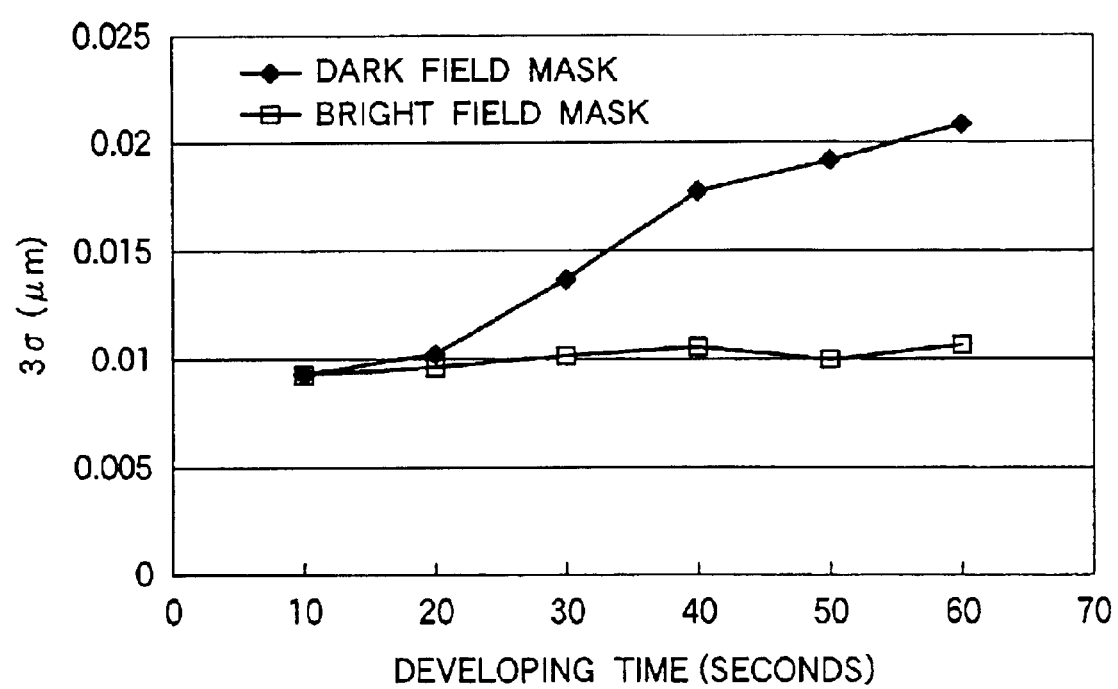
FIG. 15 is a graph showing the relationship between the developing time and the CD uniformity ($3\sigma$) in the case where the exposure treatment are carried out by using masks differing from each other in the aperture rate.
Figure 16:
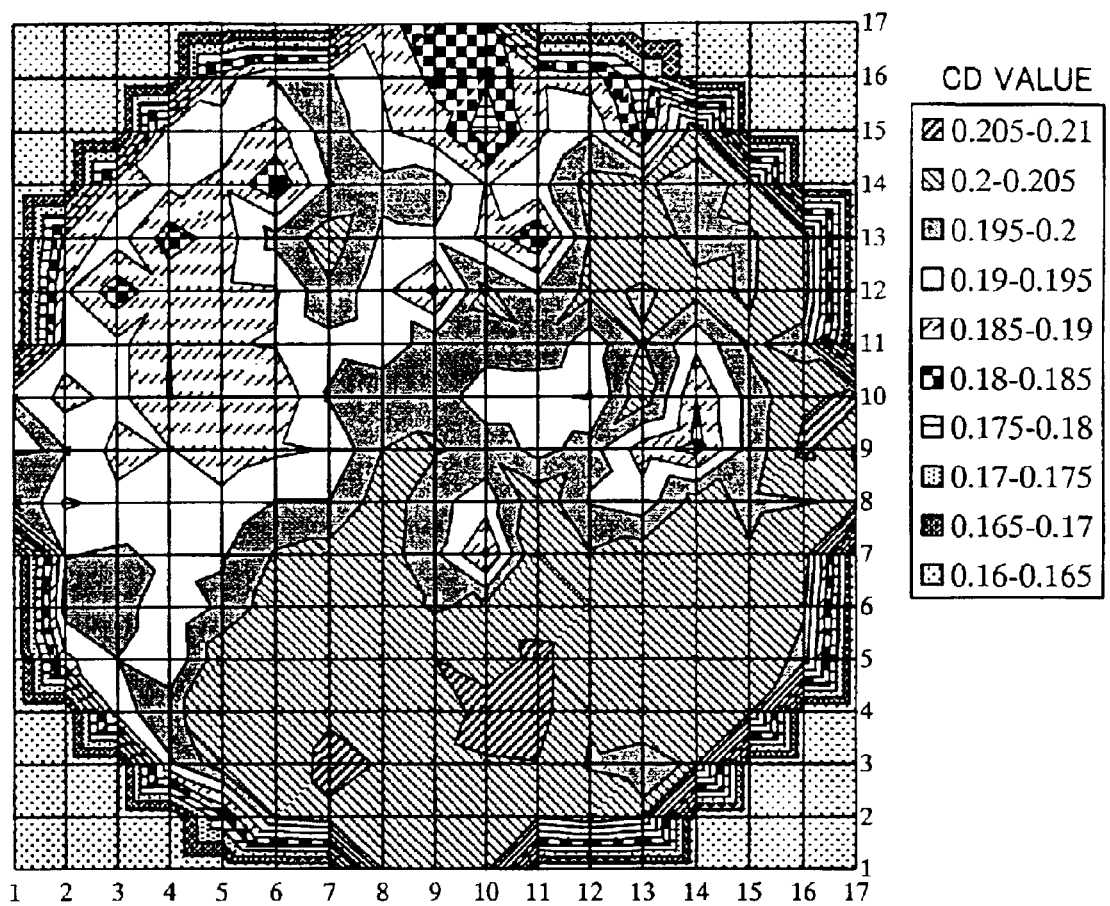
FIG. 16 shows the distribution of CD values in the case of using the dark field mask.
Figure 17:
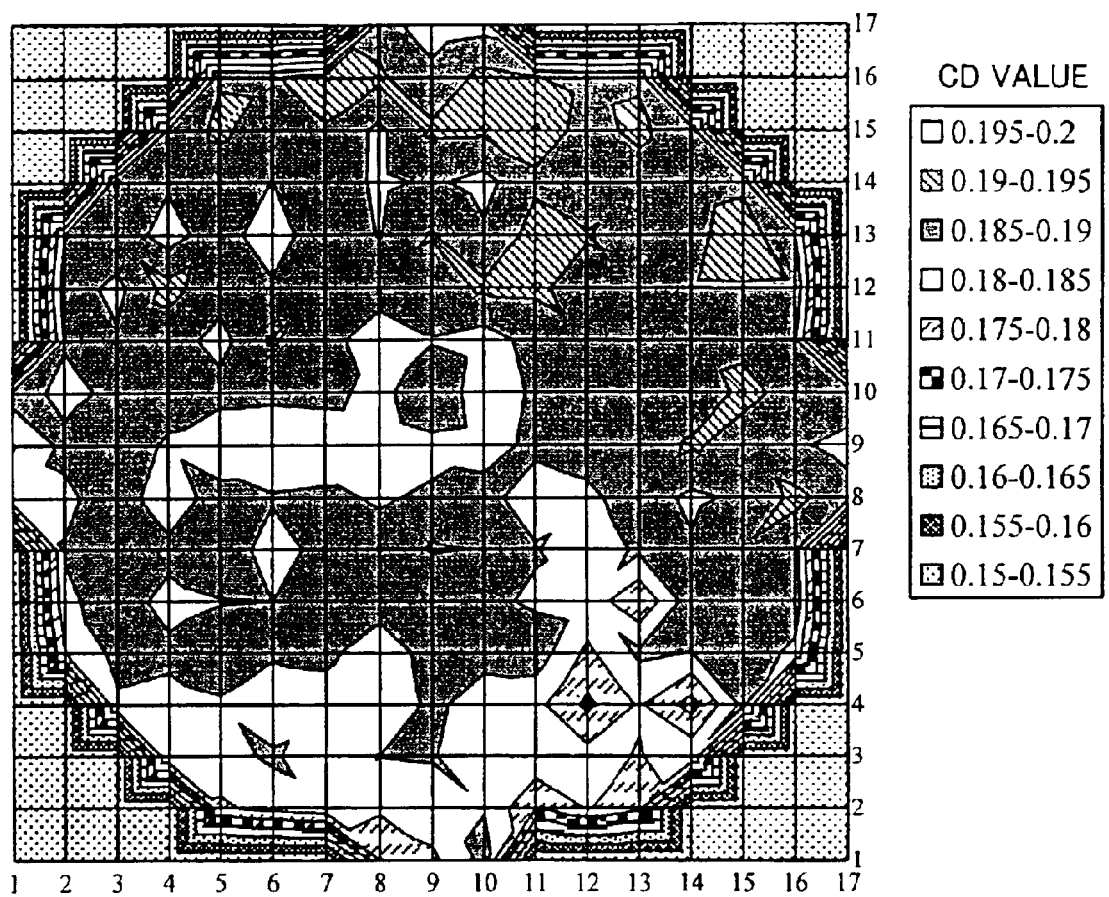
FIG. 17 shows the distribution of CD values in the case of using the bright field mask.

For example, FIG. 15 is a graph showing the relationship between the developing time and the CD uniformity (3σ), covering the case where the exposure treatment was applied to a positive resist film on the wafer W by using two kinds of masks differing from each other in the aperture rate, i.e., masks having patterns equal to each other in the line width, etc. formed thereon and differing from each other in the area of the peripheral exposure region, followed by developing the exposed resist film at various developing times. The mask having the small area of the peripheral exposure region is called a dark field mask, and the mask having the large area of the peripheral exposure region is called a bright field mask. Further, FIG. 16 shows the distribution of the CD values in the case with the dark field mask at the developing time of 60 seconds, and FIG. 17 shows the distribution of the CD values in the case with the bright field mask at the developing time of 60 seconds. In the bright field, the dependence of 3σ on the developing time is small, and the value of 3σ is small, i.e., 0.0107 μm, in the case where the developing time is 60 seconds. In the dark field, however, the value of 3σ is increased with increase in the developing time. To be more specific, the value of 3σ is increased to 0.0209 μm in the case where the developing time is 60 seconds. In other words, in the dark field, the CD uniformity is rendered poor with increase in the developing time. It is also seen that the nonuniformity of the CD value is small in the bright field and large in the dark field. It is considered reasonable to understand that the particular nonuniformity of the CD value is caused by appearing the phenomenon that the dissolved product is diffused toward the developing solution at the developing time of 20 seconds or over in the case with the dark field mask.

Figure 18:
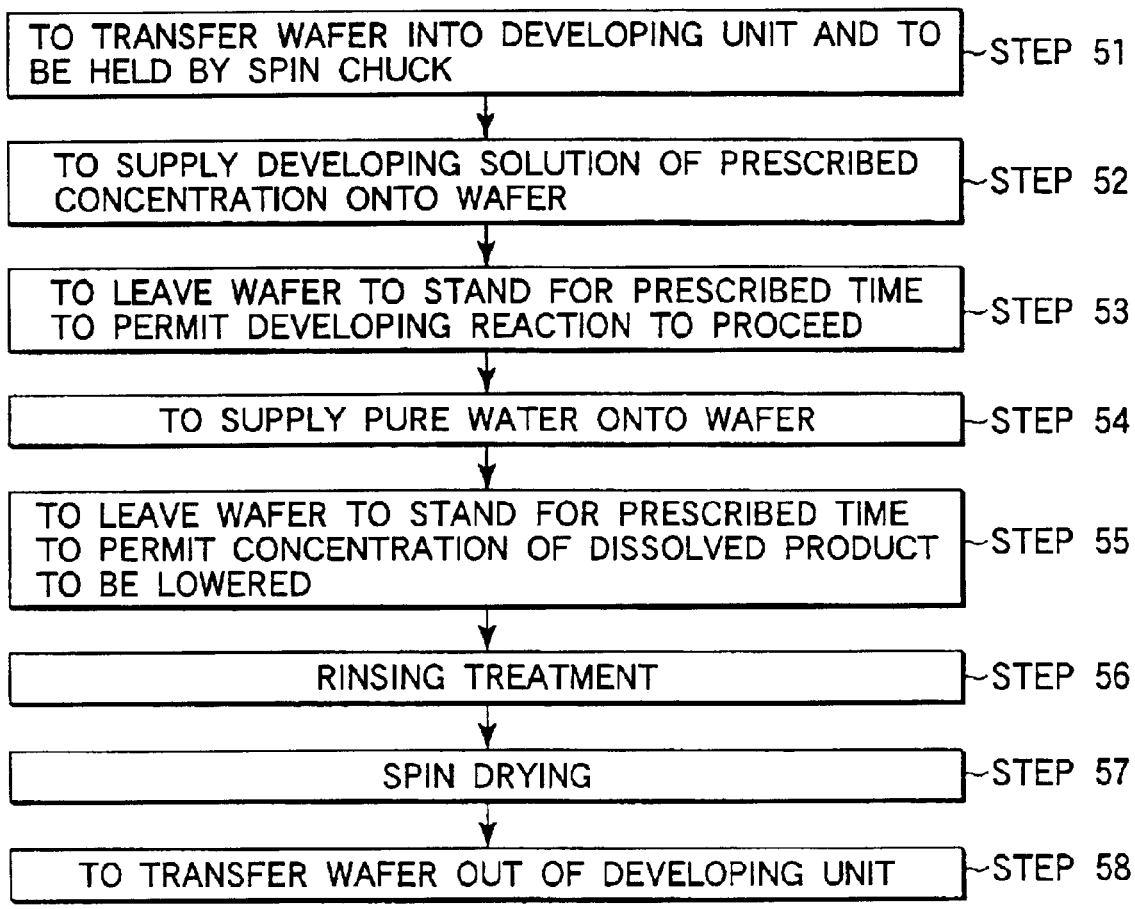
FIG. 18 is a flow chart showing a method for a developing processing for lowering the concentration of the dissolved product that locally forms a high concentration.

FIG. 18 is a flow chart exemplifying a method for the developing processing, which permits lowering the concentration of the dissolved product, which is locally increased in the latter stage of the developing reaction. Further, FIGS. 19A to 19E schematically show collectively the developing stage performed in the method for the developing processing shown in FIG. 18. In FIGS. 19A to 19E, the letters $R_1$ and $R_2$ indicate an exposed portion and an unexposed potion of a resist film R, respectively. In the first step, the wafer W is held by the spin chuck 52 (step 51), followed by supplying a developing solution of a prescribed concentration onto the wafer W disposed on the spin chuck 52 (step 52) and subsequently leaving the wafer W to stand for a prescribed time (step 53). The concentration of the developing solution used in steps 52 and 53 is determined appropriately in view of the through-put. For example, the concentration of the developing solution is set at 1.5% to 2.38%.

Figure 19A:
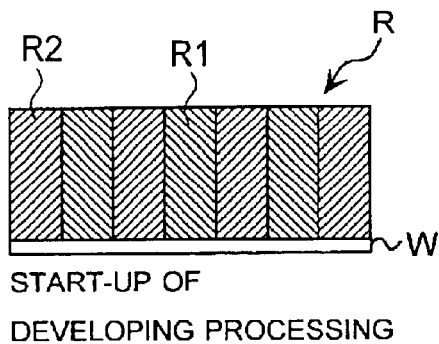
FIGS. 19A to 19E schematically show collectively the developing process in the method for the developing processing shown in FIG. 18.
Figure 19B:
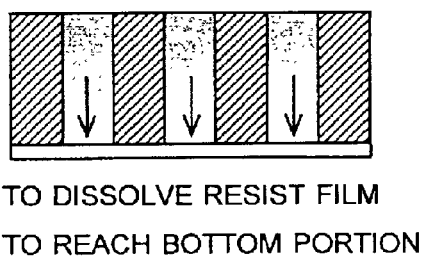
Figure 19C:
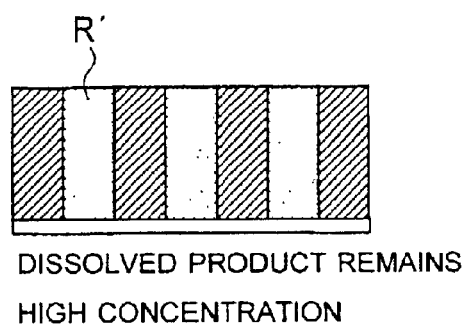

The processes in steps 52 and 53 are carried out with the wafer W held stationary, and the developing solution supplied onto the surface of the wafer W is in a semi-stationary state. Therefore, in the portion where the developing solution was supplied, the developing reaction is started from the surface of the exposed portion $R_1$ of the resist film R immediately after the start-up of the process of step 52 as shown in FIG. 19A, and the developing reaction gradually proceeds toward the bottom portion of the exposed portion $R_1$ of the resist film R, as shown in FIG. 19B. Further, a dissolved product R' of the resist film R is accumulated in a high concentration on the wafer W a prescribed time later, as shown in FIG. 19C.

In the next step, a pure water is supplied from the slit type spurting port 88b onto the developing solution held on the wafer W for a time during which the CD value is scarcely affected by the dissolved product R' thus formed, e.g., within 20 seconds after the supply of the developing solution onto the wafer W, (step 54), and the pure water thus supplied onto the developing solution is left to stand for a prescribed time (step 55).

Figure 19D:
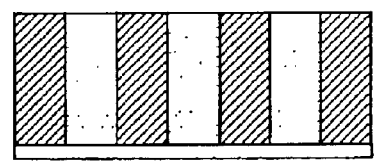

If the dissolved product is significantly stirred when a pure water is supplied onto the developing solution held on the wafer W, the CD uniformity tends to be adversely affected by the movement of the dissolved product R'. Therefore, in step 54, a pure water is supplied onto the wafer W while suppressing the stirring of the dissolved product R' and allowing the dissolved product R' to be diluted. If a pure water is supplied onto the wafer W, the dissolved product R' is gradually diffused into the pure water so as to lower the concentration of the dissolved product R' in the portion where the dissolved product R' is accumulated, as shown in FIG. 19D.

Figure 19E:
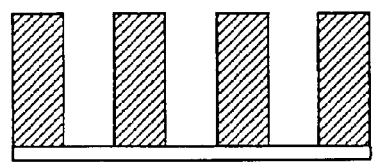

After the portion where the dissolved product R' is accumulated in a locally high concentration came into nonexistence, the rinsing treatment is carried out (step 56) as in step 4 referred to previously in conjunction with FIG. 8 so as to remove the dissolved product R', as shown in FIG. 19E. In this case, the dissolved product R' having a high concentration is not moved and, thus, it is possible to suppress the generation of the traces on the surface of the wafer W, said traces accompanying the movement of the dissolved product R', and at the same time, the influence given to the CD can be suppressed to the minimum level. After completion of the rinsing treatment, the series of processes including the spin drying (step 57) and the transfer of the wafer W out of the developing unit (DEV) (step 58) are carried out.

Figure 20:
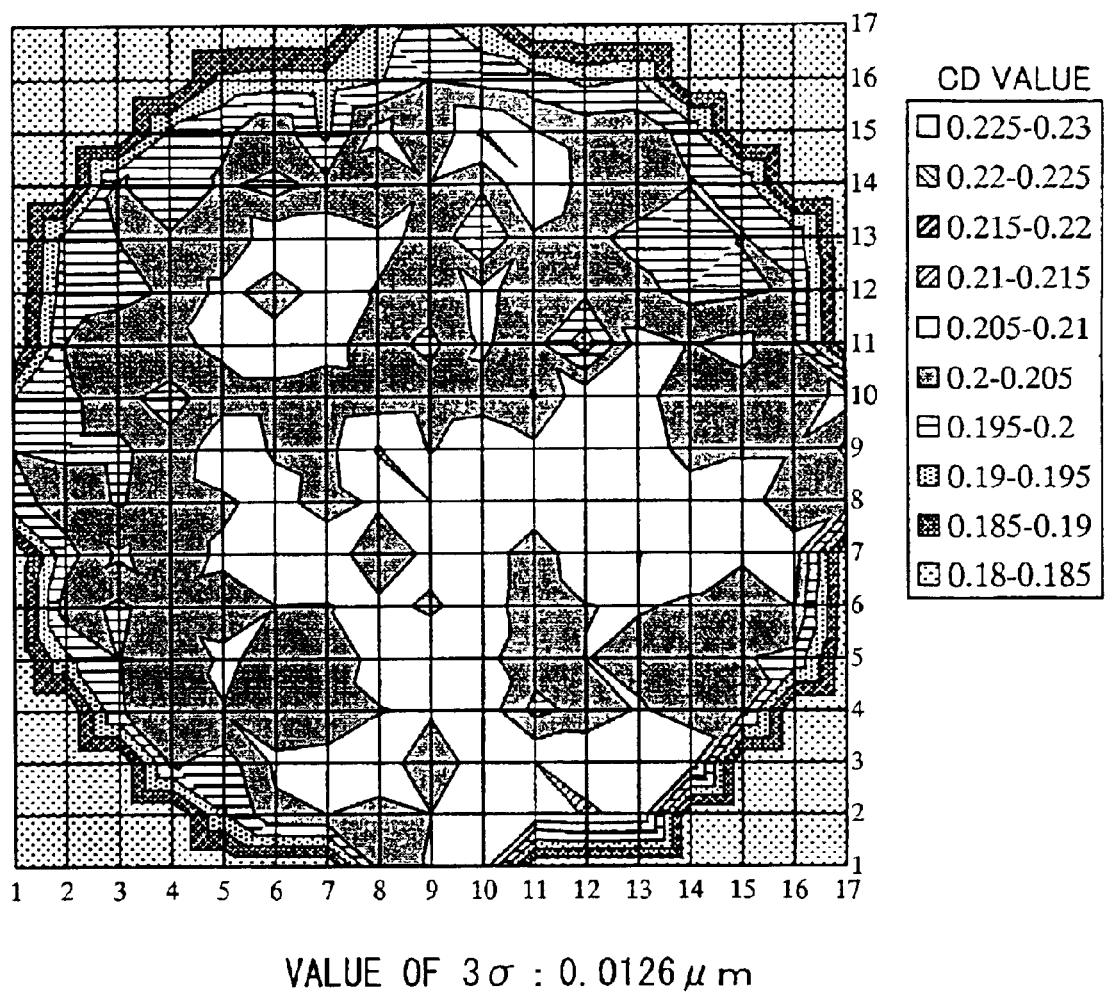
FIG. 20 shows the distribution of the CD values on a wafer in the case where a pure water is supplied onto the wafer after the supplying a developing solution.

FIG. 20 shows the distribution of the CD values on the wafer W in the case where a pure water is supplied onto the wafer W within 20 seconds after the supply of the developing solution in accordance with steps 52 to 55. As shown in FIG. 20, the distribution of the CD values is made uniform, with the result that the 3σ value is improved to 0.0126 μm from the value of 0.0209 μm for the conventional method for the developing processing shown in FIGS. 15 and 16.

As described above, a pure water is further supplied onto the developing solution supplied previously onto the wafer W in step 54. Alternatively, it is also possible to further supply in place of the pure water a developing solution having a concentration equal to or lower than that of the developing solution supplied previously onto the wafer W in step 54. In the case of using the developing solution in place of the pure water, it is also possible to permit the dissolved product to be diffused into the developing solution gradually so as to lower the concentration of the dissolved product in the portion where the dissolved product is accumulated. In the case of using a pure water, it is possible to lower the cost for the developing processing.

Figure 21:
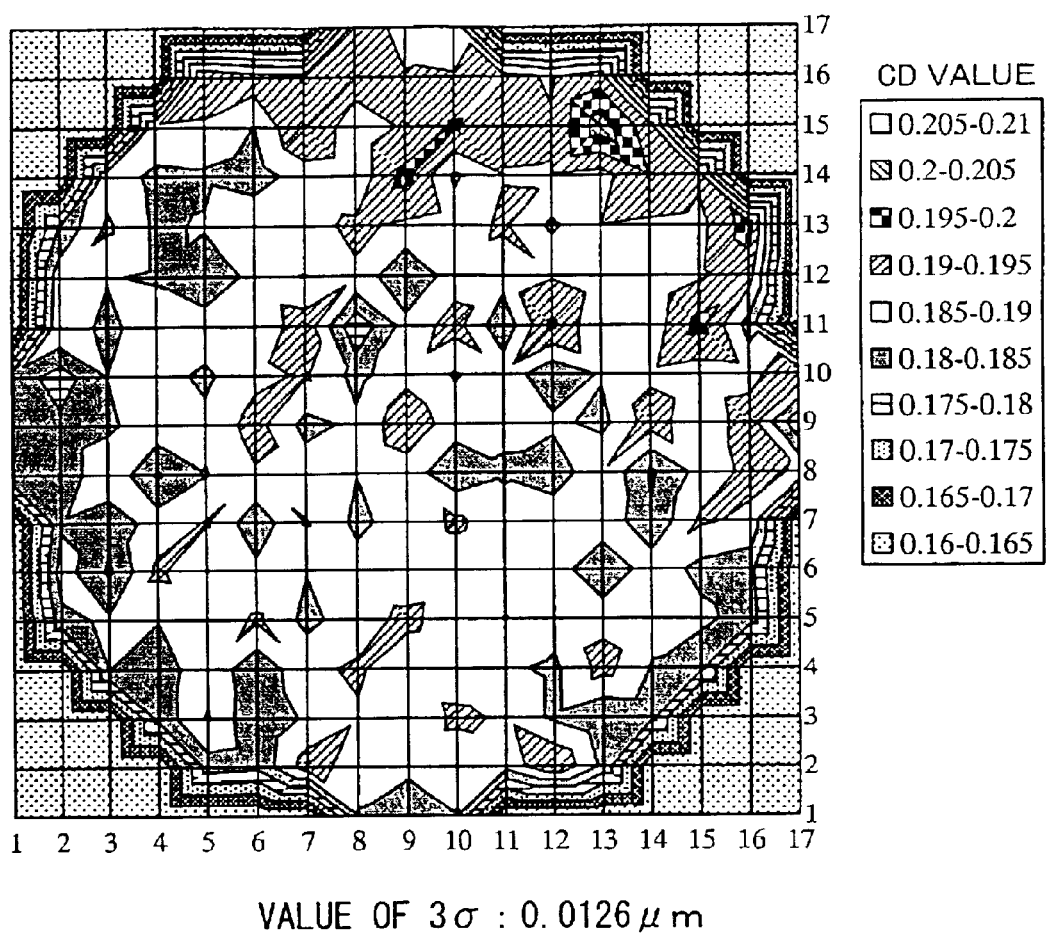
FIG. 21 shows the distribution of the CD values on a wafer in the case where a developing solution is further supplied onto the wafer after supplying another developing solution.

FIG. 21 shows the distribution of the CD values on the wafer W in the case where the developing solution equal to that supplied previously is further supplied onto the water W immediately after 20 seconds passing after the supply of the developing solution in accordance with steps 52 to 55. The 3σ value is improved to 0.0126 μm in this case, too.

Incidentally, it is certainly possible to further supply a developing solution onto the developing solution supplied previously onto the wafer W in the conventional developing processing, too. However, the additional supply of the developing solution is intended to remove or stir the developing solution supplied previously and the dissolved product so as to permit the resist film that is not dissolved to be brought into contact with the fresh developing solution and, thus, to promote the developing reaction. However, the developing method of the present invention differs from the conventional method in that, in the developing method of the present invention, the concentration of the dissolved product is naturally lowered while suppressing the stirring of the dissolved product so as to avoid the influence given by the dissolved product to CD. The developing method of the present invention is effective in particularly the case where the resist film is thin.

As described above, a developing solution having a prescribed concentration is supplied first onto the surface of the wafer W in the present invention, followed by further supplying a developing solution having a concentration not higher than that of the developing solution supplied previously or a pure water onto the developing solution supplied previously onto the surface of the wafer W in a manner to suppress the stirring of the dissolved product, thereby promoting the developing reaction. The particular method of the present invention can also be applied to the method described previously that the concentration of the developing solution used is changed to conform with the progress of the developing reaction in accordance with the dissolving characteristics of the resist film in the developing solution. As a result, it is possible to obtain a developed pattern excellent in the CD uniformity while improving the accuracy of the shape.

As described previously, it is possible to realize a developing processing that permits improving the accuracy of the shape and the CD uniformity by employing the method that, after supply of a developing solution having a prescribed concentration onto the surface of the wafer W, a pure water is further supplied onto the developing solution held on the wafer W in a manner to suppress the stirring of the dissolved product so as to permit the developing reaction to proceed. In recent years, a resist material giving rise to a problem in the case of employing the particular method has come to be used. Specifically, the particular resist material gives rise to the problem that, when a pure water is added to a developing solution so as to dilute the developing solution, the pH value of the developing solution is rapidly changed so as to precipitate the dissolved product in the form of a solid, and the precipitated material is attached to the developed pattern.

The method for the developing processing that permits preventing the generation of a solid precipitate while improving the accuracy of the shape and the CD uniformity includes the method that, after a developing solution having a prescribed concentration is once supplied onto the surface of the wafer W, a liquid performing the pH adjusting function such that the pH value of the developing solution is not rapidly changed when the particular liquid is added to the developing solution is supplied onto the surface of the wafer W in a manner to suppress the stirring of the dissolved product so as to diffuse the dissolved product into the liquid. In this case, it is necessary for the liquid performing the pH adjusting function not to dissolve the resist film or to be low in the dissolving power of the resist film and not to react with the components of the developing solution and the dissolved product of the resist so as not to precipitate a solid material.

There is a large difference in the pH value between the TMAH solution and a pure water. For example, the TMAH solution has a pH value of 13 to 14, whereas the pH value of the pure water is about 7. It is possible to suppress the change in the pH value of the developing solution supplied previously onto the wafer W and to suppress the generation of a solid precipitate by using a solution having a pH value of 9 to 12 such as an ammonia water, an aqueous solution prepared by adding a prescribed amount of a surfactant to a pure water, or a hydrophilic organic solvent. It is also possible to supply, after a developing solution having a prescribed concentration is once supplied onto the surface of the wafer W, a developing solution having a concentration lower than that of the developing solution supplied previously and having a pH value of about 9 to 12 in a manner to suppress the stirring of the dissolved product. To be more specific, in the case of using a TMAH solution, it is desirable to set the concentration of the TMAH solution to fall within a range of between 0.1% and 1.5%.

Figure 22:
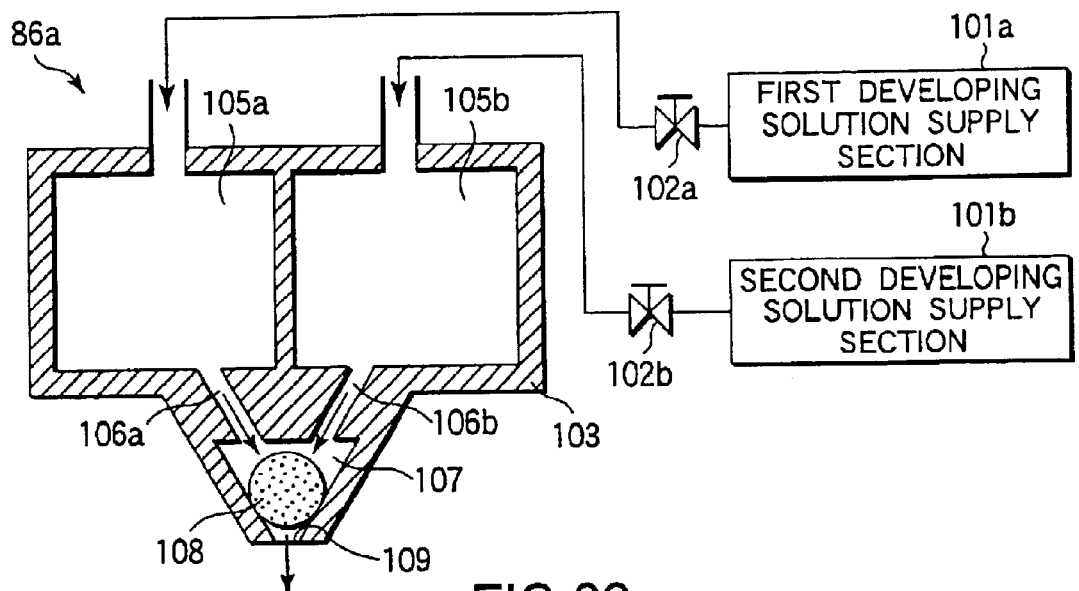
FIG. 22 is a cross sectional view schematically showing a developing solution spurting nozzle according to another embodiment of the present invention.

The construction of the developing solution spurting nozzle that is suitably used in the developing processing that permits preventing the generation of a solid precipitate derived from the dissolved product will now be described. FIG. 22 is a cross sectional view schematically showing the construction of the developing solution spurting nozzle 86*a*. As shown in the drawing, the developing solution spurting nozzle 86*a* is long like the developing solution spurting nozzle 86 and is arranged horizontal in its longitudinal direction, i.e., the direction perpendicular to the paper. The developing solution spurting nozzle 86*a* includes a tubular body 103. A first developing solution reservoir 105*a* and a second developing solution reservoir 105*b* are independently arranged within the tubular body 103. A developing solution having a prescribed concentration, e.g., a TMAH solution having a concentration of 2.38%, is supplied from a first developing solution supply section 101a into the first developing solution reservoir 105a by opening a valve 102a. On the other hand, a developing solution having a prescribed concentration, e.g., a TMAH solution having a concentration of 0.5%, is supplied from a second developing solution supply section 101b into the second developing solution reservoir 105b by opening a valve 102b.

A liquid mixing chamber 107 having a slit type spurting port 109 formed in the lower end is arranged within the tubular body 103 so as to be positioned below the first developing solution reservoir 105a and the second developing solution reservoir 105b. The liquid mixing chamber 107 communicates with the first developing solution reservoir 105a via a first communicating passageway 106a and with the second developing solution reservoir 105b via a second communicating passageway 106b. In the developing solution spurting nozzle 86a of the particular construction, it is possible to spurt any one of the developing solution supplied from the first developing solution supply section 101a and the developing solution supplied from the second developing solution supply section 101b from the slit type spurting port 109 through the liquid mixing chamber 107. The liquid mixing chamber 107 is also used as a simple passageway of the developing solution. Further, in the developing solution spurting nozzle 86a, it is also possible to mix the developing solution supplied from the first developing solution supply section 101a and the developing solution supplied from the second developing solution supply section 101b within the liquid mixing chamber 107 so as to adjust the concentration of the developing solution at a desired level and to spurt the developing solution having the adjusted concentration from the slit type spurting port 109.

Incidentally, a buffer rod 108 is arranged within the liquid mixing chamber 107. The buffer rod 108 permits making the spurting state of the developing solution from the slit type spurting port 109 uniform in the longitudinal direction of the developing solution spurting nozzle 86a. In addition, leakage of the developing solution from the slit type spurting port 109 is prevented by the buffer rod 108. It should also be noted that the buffer rod 108 performs the function of mixing uniform the developing solutions flowing into the liquid mixing chamber 107 from the first developing solution reservoir 105a and the second developing solution reservoir 105b. Incidentally, it is possible to construct the developing solution spurting nozzle 86a such that a pure water is supplied in place of the developing solution from the second developing solution supply section 101b into the second developing solution reservoir 105b.

Figure 23:
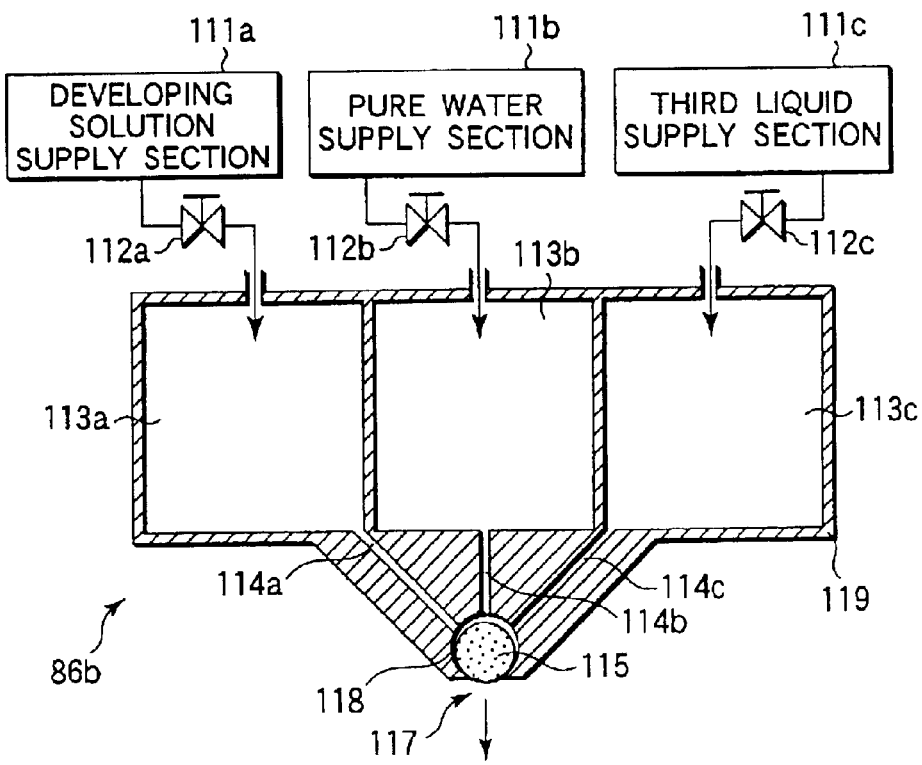
FIG. 23 is a cross sectional view schematically showing a developing solution spurting nozzle according to still another embodiment of the present invention.

FIG. 23 is a cross sectional view schematically showing the construction of the developing solution spurting nozzle 86b. As shown in the drawing, the developing solution spurting nozzle 86b is long like the developing solution spurting nozzle 86 and is arranged horizontal in its longitudinal direction, i.e., the direction perpendicular to the paper. The developing solution spurting nozzle 86b includes a tubular body 119. A developing solution reservoir 113a, a pure water reservoir 113b, and a third liquid reservoir 113c are independently arranged within the tubular body 119 of the developing solution spurting nozzle 86b. A developing solution having a prescribed concentration, e.g., a TMAH solution having a concentration of 2.38%, is supplied from a developing solution supply section 111a into the developing solution reservoir 113a by opening a valve 112a. A pure water is supplied from a pure water supply section 111b into the pure water reservoir 113b by opening a valve 112b. Further, a third solution, e.g., a solution having a function of adjusting the pH value, is supplied from a third liquid supply section 111c into the third liquid reservoir 113c by opening a valve 112c.

In the tubular body 119, a liquid mixing chamber 118 is formed below the reservoirs 113a to 113c so as to communicate with the reservoirs 113a, 113b and 113c via communicating passageways 114a, 114b and 114c, respectively. The lower end of the liquid mixing chamber 118 forms a slit type spurting port 117, and a buffer rod 115 is arranged within the liquid mixing chamber 118. The buffer rod 115 serves to make the spurting state of the developing solution, etc. from the slit type spurting port 117 uniform in the longitudinal direction of the developing solution spurting nozzle 86b and prevents the leakage of the developing solution from the slit type spurting port 117.

The method for the developing processing using the developing solution spurting nozzle 86b can be performed, for example, as follows. In the first step, a prescribed amount of the developing solution and a prescribed amount of a pure water are supplied from the developing solution supply section 111a and the pure water supply section 111b into the liquid mixing chamber 118 through the developing solution reservoir 113a and the pure water reservoir 113b, respectively. The developing solution and the pure water are mixed within the liquid mixing chamber 118 so as to prepare a developing solution having a desired concentration, and the developing solution of a desired concentration thus prepared is spurted from the slit type spurting port 117 onto the surface of the wafer W. As a result, the developing solution is held on the wafer W so as to start the developing reaction.

A prescribed time later, a prescribed amount of a pure water is supplied from the pure water supply section 111b into the pure water reservoir 113b. At the same time, a solution performing the function of adjusting the pH value is supplied from the third liquid supply section 111c into the third liquid reservoir 113c. Then, the pure water and the solution performing the function of adjusting the pH value are mixed within the liquid mixing chamber 118 so as to prepare a solution performing the pH adjusting function and having a desired concentration. The solution performing the pH adjusting function thus prepared is spurted from the slit type spurting port 117 onto the developing solution held on the surface of the wafer W. In this fashion, it is possible to apply a developing processing to the wafer W without rapidly changing the pH value of the developing solution supplied previously onto the wafer W. Incidentally, it is possible to supply a different kind of a developing solution into the developing solution spurting nozzles 86a, 86b in place of the pure water and the third solution performing the pH adjusting function. In this case, it is possible to carry out various kinds of prescribed developing processing by using a single nozzle.

The present invention is not limited to the various embodiments described above. For example, the method of the present invention for the developing processing can be suitably applied to the cases where an exposure treatment is applied to a resist film by using a KrF ray, an ArF ray or an $F_2$ ray. Further, a developing processing of a higher accuracy can be performed in the case of using a g-line or an i-line. Further, the description given above covers the developing method with attentions paid to the reactivity of the resist film (resist material) relative to the developing solution. Where, for example, the resist film has a high dissolving rate in the developing solution and tends to be swollen easily by the developing solution, the concentration of the developing solution used in the latter stage of the developing reaction is set at a value at which the resist film is not excessively dissolved and, in addition, the dissolving rate is balanced with the swelling rate. Further, it is not absolutely necessary to use two kinds of developing solutions differing from each other in concentration. It is possible to perform the developing processing more accurately by supplying more kinds of developing solutions differing from each other in concentration onto the surface of the wafer W a prescribed time later.

In the description given above, a TMAH solution having a concentration of 2.38% was exemplified as a developing solution having a high concentration. Of course, it is possible to use a developing solution having a higher concentration as far as a prescribed accuracy of the shape and a prescribed CD uniformity can be obtained. Further, it is desirable to construct the developing solution spurting nozzle such that three nozzles each having a single slit type spurting port are arranged in parallel and each nozzle is provided with a lift mechanism. In this case, a fresh developing solution or a pure water is spurted onto the surface of the wafer W while preventing the tip of the nozzle from contacting the developing solution supplied previously onto the wafer W. In each of the embodiments described above, a semiconductor wafer is exemplifies as a substrate. However, it is also possible to apply each of the various methods for the developing processing described above to the photolithography step of, for example, a glass substrate for a liquid crystal display (LCD).

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. The method for a developing processing of a resist film formed on a substrate, said resist film being applied to an exposure treatment, said method comprising the steps of:
   supplying a developing solution onto said substrate;
   leaving the substrate having said developing solution supplied thereto to stand for a prescribed time so as to permit a developing reaction to proceed;
   supplying a liquid that does not dissolve a resist film or a liquid low in the dissolving power of the resist film onto the substrate having said developing solution supplied thereto;
   leaving the substrate having said liquid supplied thereto to stand for a prescribed time so as to permit the concentration of the dissolved product formed by said developing solution to be lowered by said liquid; and
   rinsing the substrate having said liquid supplied thereto,
   wherein the step of supplying said liquid onto said substrate is carried out by using a nozzle capable of spurting said liquid in substantially the band shape such that said nozzle is scanned over said substrate while spurting said liquid from said nozzle in substantially the band shape.

2. The method for a developing processing according to claim 1, wherein the substrate receiving said developing solution is left to stand for the time during which the developing reaction proceeds to reach the lower end of said resist film.

3. The method for a developing processing of a resist film formed on a substrate, said resist film being applied to an exposure treatment, said method comprising the steps of:
   supplying a developing solution onto said substrate;
   leaving the substrate having said developing solution supplied thereto to stand for a prescribed time so as to permit a developing reaction to proceed;
   supplying a liquid that does not dissolve a resist film or a liquid low in the dissolving power of the resist film onto the substrate having said developing solution supplied thereto;
   leaving the substrate having said liquid supplied thereto to stand for a prescribed time so as to permit the concentration of the dissolved product formed by said developing solution to be lowered by said liquid; and
   rinsing the substrate having said liquid supplied thereto,
   wherein the step of supplying said developing solution onto said substrate is carried out by using a nozzle capable of spurting said developing solution in substantially the band shape such that said nozzle is scanned over said substrate while spurting said developing solution from said nozzle in substantially the band shape.

4. The method for a developing processing according to claim 1, wherein the processing step with said developing solution and said liquid is carried out by holding said substrate stationary, and the rinsing step of said substrate is carried out by rotating the substrate.

5. The method for a developing processing according to claim 1, wherein any of a diluted developing solution, a pure water, an aqueous solution prepared by adding a surfactant to a pure water, and a hydrophilic organic solvent is used as said liquid.

6. The method for a developing processing according to claim 1, wherein a liquid performing a pH adjusting function to prevent the pH value of the developing solution supplied onto said substrate from being changed rapidly is used as said liquid.

7. The method for a developing processing according to claim 3, wherein the substrate receiving said developing solution is left to stand for the time during which the developing reaction proceeds to reach the lower end of said resist film.

8. The method for a developing processing according to claim 3, wherein the processing step with said developing solution and said liquid is carried out by holding said substrate stationary, and the rinsing step of said substrate is carried out by rotating the substrate.

9. The method for a developing processing according to claim 3, wherein any of a diluted developing solution, a pure water, an aqueous solution prepared by adding a surfactant to a pure water, and a hydrophilic organic solvent is used as said liquid.

10. The method for a developing processing according to claim 3, wherein a liquid performing a pH adjusting function to prevent the pH value of the developing solution supplied onto said substrate from being changed rapidly is used as said liquid.

* * * * *